(12) United States Patent
Wong et al.

(10) Patent No.: US 10,684,389 B2
(45) Date of Patent: Jun. 16, 2020

(54) MOLDED RANGE AND PROXIMITY SENSOR WITH OPTICAL RESIN LENS

(71) Applicants: STMicroelectronics Pte Ltd, Singapore (SG); STMICROELECTRONICS (RESEARCH & DEVELOPMENT) LIMITED, Marlow (GB)

(72) Inventors: Wing Shenq Wong, Singapore (SG); Andy Price, Bonnyrigg (GB); Eric Christison, Edinburgh (GB)

(73) Assignees: STMICROELECTRONICS (RESEARCH & DEVELOPMENT) LIMITED, Marlow (GB); STMICROELECTRONICS PTE LTD, Singapore (SG)

( * ) Notice: Subject to any disclaimer, the term of this patent is extended or adjusted under 35 U.S.C. 154(b) by 92 days.

(21) Appl. No.: 16/107,911

(22) Filed: Aug. 21, 2018

(65) Prior Publication Data
US 2019/0004207 A1    Jan. 3, 2019

Related U.S. Application Data

(63) Continuation of application No. 14/832,971, filed on Aug. 21, 2015, now Pat. No. 10,061,057.

(51) Int. Cl.
*H01L 31/167* (2006.01)
*G01V 8/12* (2006.01)
*H01L 25/16* (2006.01)

(52) U.S. Cl.
CPC .............. *G01V 8/12* (2013.01); *H01L 25/167* (2013.01); *H01L 31/167* (2013.01); *H01L 2224/48091* (2013.01); *H01L 2224/48227* (2013.01); *H01L 2224/73265* (2013.01)

(58) Field of Classification Search
CPC . H01L 25/167; H01L 31/173; H01L 31/0203; H01L 31/167; G01S 7/481; G01S 7/4813; G01S 17/026
See application file for complete search history.

(56) References Cited

U.S. PATENT DOCUMENTS

| 6,169,295 | B1 | 1/2001 | Koo |
| 8,143,608 | B2 | 3/2012 | Yao et al. |
| 8,148,808 | B2 | 4/2012 | Braden et al. |

(Continued)

FOREIGN PATENT DOCUMENTS

| CN | 103512596 A | 1/2014 |
| CN | 104600065 A | 5/2015 |

(Continued)

*Primary Examiner* — Thanh Luu
(74) *Attorney, Agent, or Firm* — Seed IP Law Group LLP

(57) ABSTRACT

A method for forming a molded proximity sensor with an optical resin lens and the structure formed thereby. A light sensor chip is placed on a substrate, such as a printed circuit board, and a diode, such as a laser diode, is positioned on top of the light sensor chip and electrically connected to a bonding pad on the light sensor chip. Transparent, optical resin in liquid form is applied as a drop over the light sensor array on the light sensor chip as well as over the light-emitting diode. After the optical resin is cured, a molding compound is applied to an entire assembly, after which the assembly is polished to expose the lenses and have a top surface flush with the top surface of the molding compound.

20 Claims, 18 Drawing Sheets

(56) References Cited

U.S. PATENT DOCUMENTS

| | | |
|---|---|---|
| 8,716,739 B2 | 5/2014 | Coffy et al. |
| 9,136,292 B2 | 9/2015 | Coffy et al. |
| 9,305,967 B1 | 4/2016 | Tharumalingam |
| 9,354,111 B2 | 5/2016 | Kerness et al. |
| 9,570,648 B2 | 2/2017 | Tharumalingam et al. |
| 2009/0051804 A1 | 2/2009 | Nomura et al. |
| 2010/0259766 A1 | 10/2010 | Wiese et al. |
| 2011/0108714 A1 | 5/2011 | Yang et al. |
| 2015/0115139 A1 | 4/2015 | Okushiba |
| 2016/0163747 A1* | 6/2016 | Koide ................ H01L 27/1443 257/80 |
| 2016/0306042 A1 | 10/2016 | Schrank et al. |

FOREIGN PATENT DOCUMENTS

| | | |
|---|---|---|
| CN | 204461448 U | 7/2015 |
| DE | 196 16 969 A1 | 10/1997 |
| EP | 0 992 824 A2 | 4/2000 |
| EP | 1 351 319 A2 | 10/2003 |
| GB | 2 312 551 A | 10/1997 |

\* cited by examiner

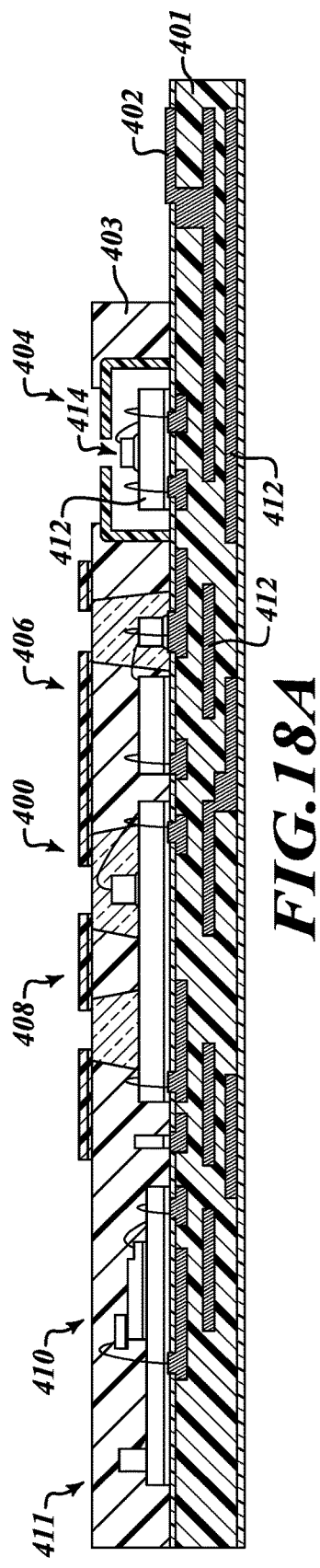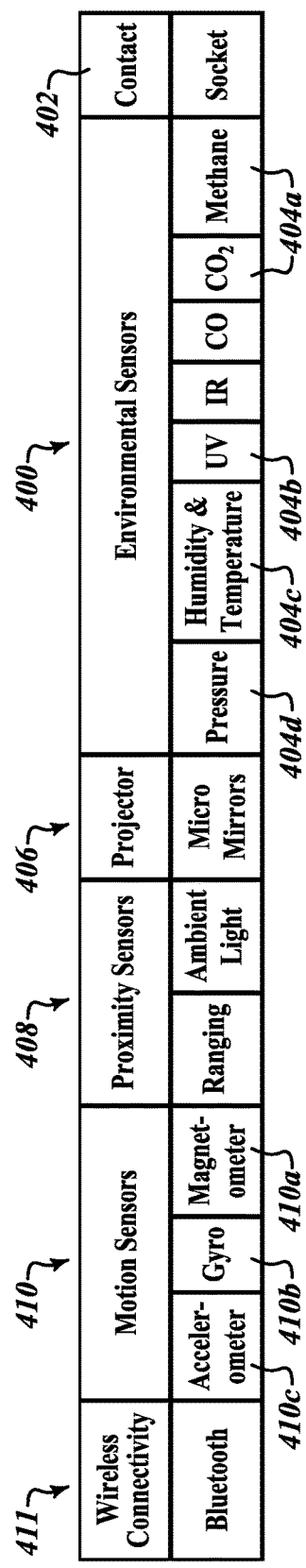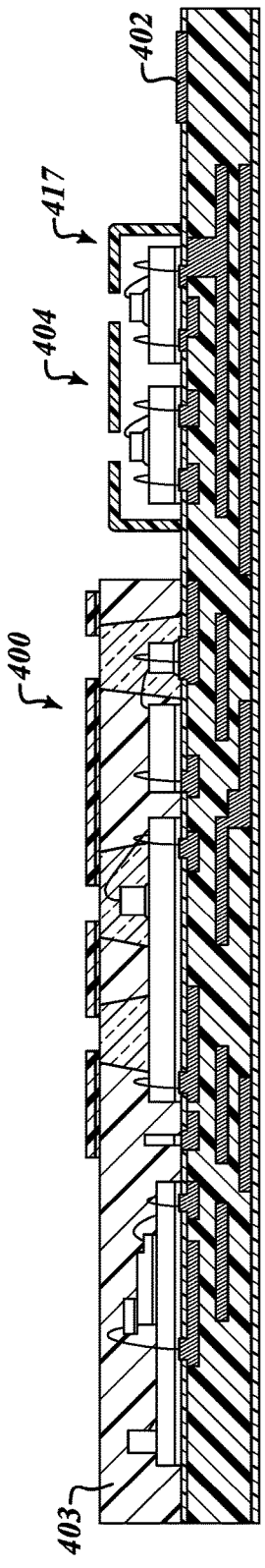

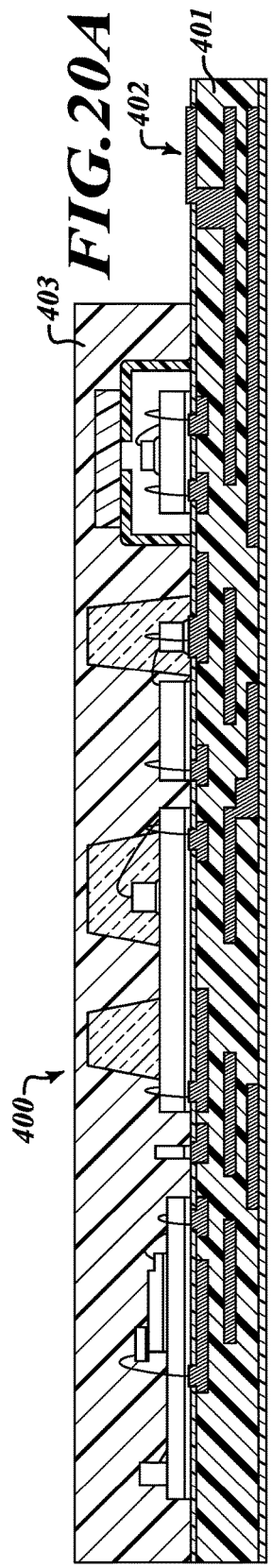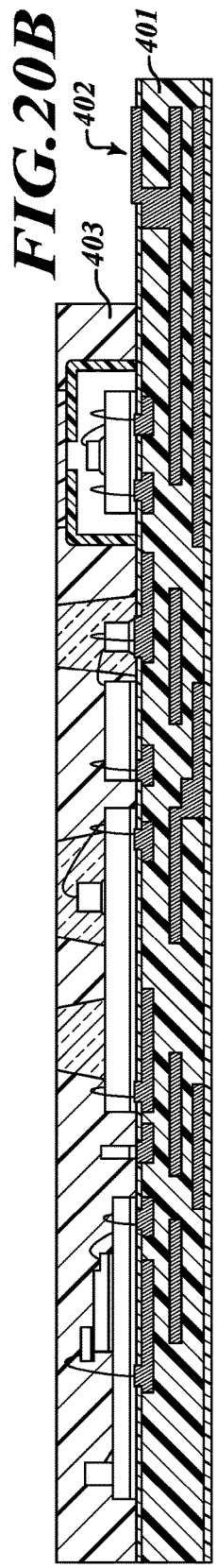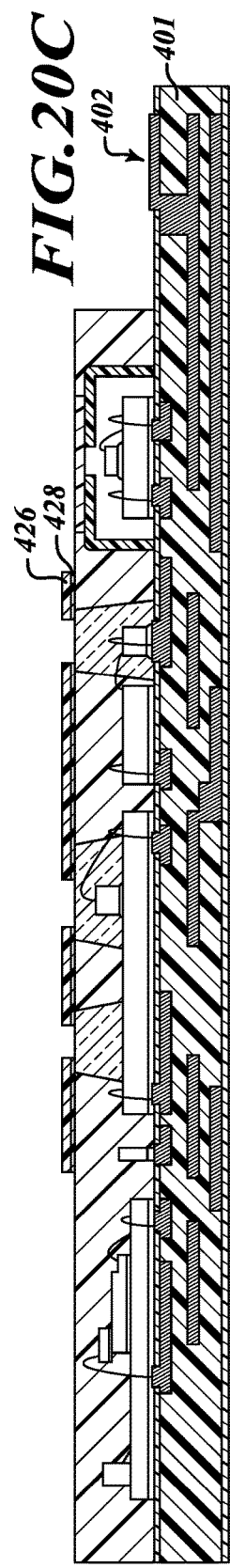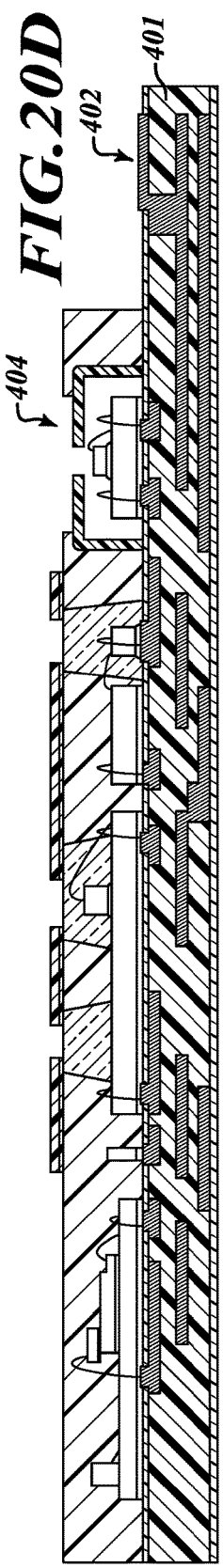

MOLDED RANGE AND PROXIMITY SENSOR WITH OPTICAL RESIN LENS

BACKGROUND

Technical Field

This invention is in the field of proximity sensors and, in particular, a laser diode proximity sensor in a single integrated package.

Description of the Related Art

Proximity sensors are frequently used in cell phones, tablets, and personal computing devices. For example, when a person is making a phone call, a proximity sensor in the phone will detect when the phone is close to the ear or hair during a call to switch off the screen for touch sensitivity. Further, if the phone is placed face down on a surface, it will switch to screen off for power saving. The sensor may also include a ranging sensor to measure the distance to the object. In addition, the light sensor may include an ambient light sensor which is added to the proximity sensor or ranging sensor. The ambient light sensor in a smart phone will check the light in the immediate vicinity and vary the screen brightness to automatically adjust the screen based on the ambient light.

FIGS. 1A and 1B are images of a prior art proximity sensor 10. Looking at both figures together, the proximity sensor 10 of the prior art includes a plastic housing 12 which is glued with an adhesive 14 to a base substrate 16. Apertures 18 and 20 permit light to be emitted and received, respectively. The diode 22 emits light which will be sensed by the light sensor 24 if the proximity sensor is near an object, such as less than one to two centimeters away.

A glass lens 26 is attached by glue to the plastic cap 12 to protect the diode 22 and permit light to be emitted. Similarly, a glass lens 28 is glued to the plastic cap 12 adjacent the light sensor to protect and seal the cavity holding the chip and filter the light. The plastic cap 12 also includes a central barrier 30 which is adhered by glue to the chip 24 in order to block light passing directly from the diode 22 to the light sensor 28.

There are a number of shortcomings and difficulties with assembling the package of the prior art. A first difficulty is the number of small parts which must be assembled. The package has a footprint area in the range of 2.5 to 2.8 millimeters and therefore the individual components are very small. The automatic machinery that assembles the device has difficulty working with such small parts. There is also significant difficulty in lens placement accuracy. The lenses may tilt slightly, thus reflecting a large amount of light. The prior art has the disadvantage of a large chamber and light which may be reflected from the glass lens. Another problem is the glue dispensing process may create voids, bubbles, or bumps, which make the different parts uneven, including the plastic cap, the diode, the central barrier 30, and the lenses. Another problem is the likelihood of glue overflow. If too much glue is used, it may flow from underneath the central barrier 30 to cover part of the light sensing circuit 28. Accordingly, it is preferred to provide an improved proximity sensor.

BRIEF SUMMARY

According to principles of the embodiment as disclosed herein, an optical resin is dispensed as a small drop which will harden to provide the lens over the diode and the light sensing array. The optical resin is transparent or may have a slight color to it in order to provide color filter, if desired. The use of a liquid dispensed optical resin provides a more reliable optical path than the prior art cap concept with the glass lens because the light is entrained within the optical resin more completely.

After the optical resin is dispensed onto the light-emitting diode and the light sensor, the chips, together with the optical lenses, are encapsulated in a molding compound that completely encases both of the chips as well as the optical pass. The molding compound provides the assurance of a complete block of all light that may cross-talk between the light source and the light sensor. Accordingly, an additional central barrier of a plastic cap is not needed to prevent optical cross-talk. This permits elimination of the cap, which avoids the need to attach items together within a small tolerance. Further, this eliminates the need for any glue at the central barrier, which avoids the problems of glue void, glue overflow, and the difficulty of carefully aligning the small parts.

Further, there is no need for the placement of the individual parts of plastic and glass. Rather, the optical resin can be easily dispensed using known technology, after which the entire assembly is encased in molding compound. After the assembly is encased in molding compound, the array is polished to expose the lenses and then cut into individual package die to provide the completed proximity sensor and module.

Among the advantages of the invented proximity sensor module is that it is lower in cost, along with being more rugged and reliable than the prior art. Further, the manufacturing steps are significantly simplified and there are higher yields of proximity sensor modules than was possible in the prior art.

BRIEF DESCRIPTION OF THE SEVERAL VIEWS OF THE DRAWINGS

FIG. 18A is a side cross-sectional view of one embodiment of the mobile sensor stick of FIG. 17.

FIG. 18B is a schematic topside view illustrating the types of sensors and their respective locations on the mobile sensor stick of FIG. 17.

FIG. 19 is a further alternative embodiment of the mobile sensor stick.

FIGS. 20A-20D illustrate various stages in the manufacture of the mobile sensor stick of FIG. 17.

DETAILED DESCRIPTION

Figure 1A:
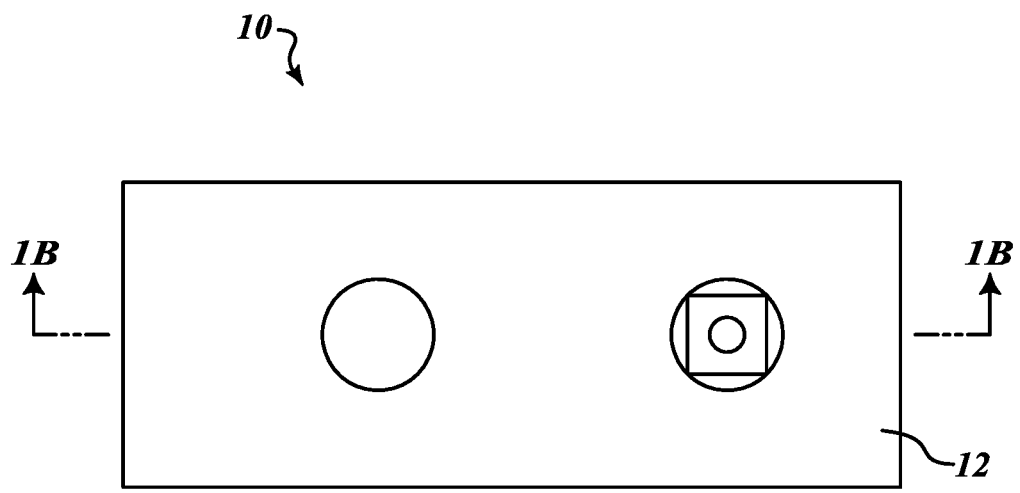
FIG. 1A is a top plan view of a prior art proximity sensor module.
Figure 1B:
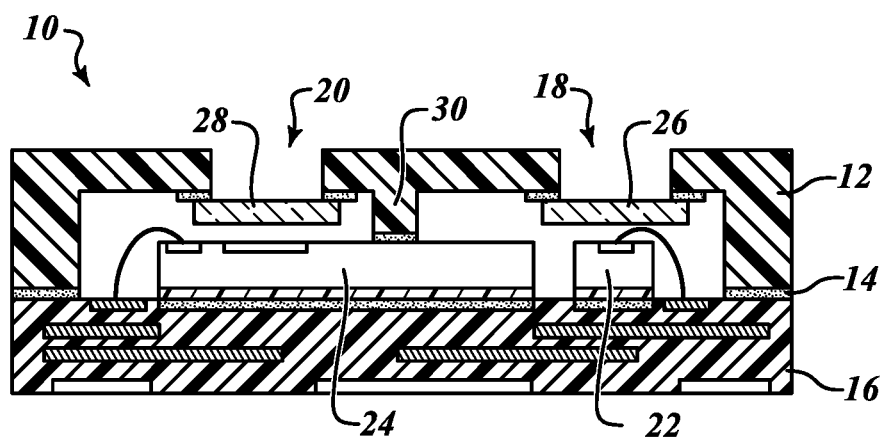
FIG. 1B is a cross-sectional view taken along lines 1B-1B of FIG. 1A.
Figure 2:
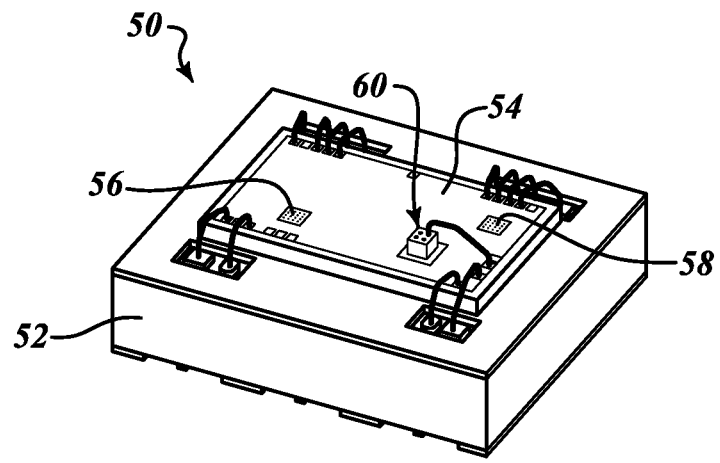
FIG. 2 is an isometric view of a proximity sensor module at an early productive stage according to one embodiment as discussed herein.

FIG. 2 shows the inventive proximity sensor module 50 at an early stage of manufacture. The proximity sensor module 50 includes a substrate 52 on which is mounted a light sensor chip 54. The light sensor chip 54 includes at least one light sensor 56 and, in some instances, a second light sensor 58. The light sensor 56 is preferably a photon avalanche diode or diodes and thus can sense the presence as well as the quantity of light that impinges thereon. Mounted directly on top of the light sensor chip 54 at a location spaced from the light sensor 56 is a light source 60. The light source 60 is preferably a laser diode, such as a DCSEL or other acceptable light emitter.

Figure 3:
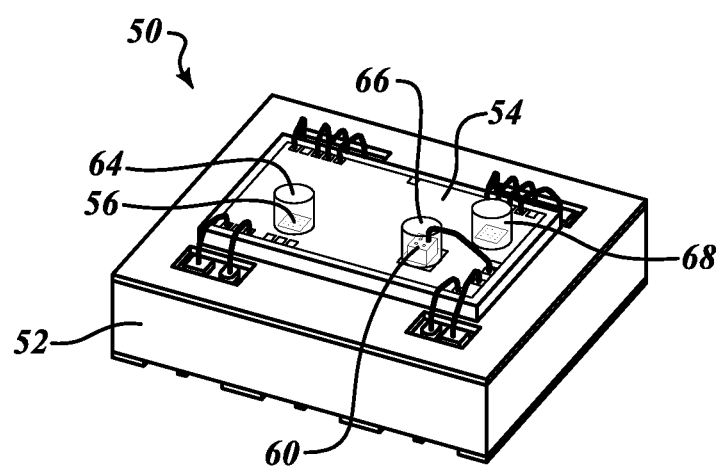
FIG. 3 is an isometric view of the proximity sensor module at a later stage during manufacture according to principles as disclosed herein.

FIG. 3 illustrates the proximity sensor module at a next stage in manufacture. A drop of optical resin is placed directly over each of the light-emitting sources as well as over each of the light sensors. Any acceptable transparent or translucent optical resin may be used. As will be appreciated, the optical resin has a relatively high viscosity and thus will form a rounded ball or lump directly over the light source and light sensor in which it is placed. A first drop of optical resin glue 64 is placed over the light sensor 56, a second drop 66 is placed over the light-emitting diode 60 and, if a further light sensor 58 is present, a third drop 68 is placed over any further light sensors.

The optical resin glue will be of a type that beads up to form a rounded bump or bubble because of the viscosity of the fluid when it is applied. It is then cured to harden, either with a UV cure, or heat, or other acceptable cure.

Figure 4:
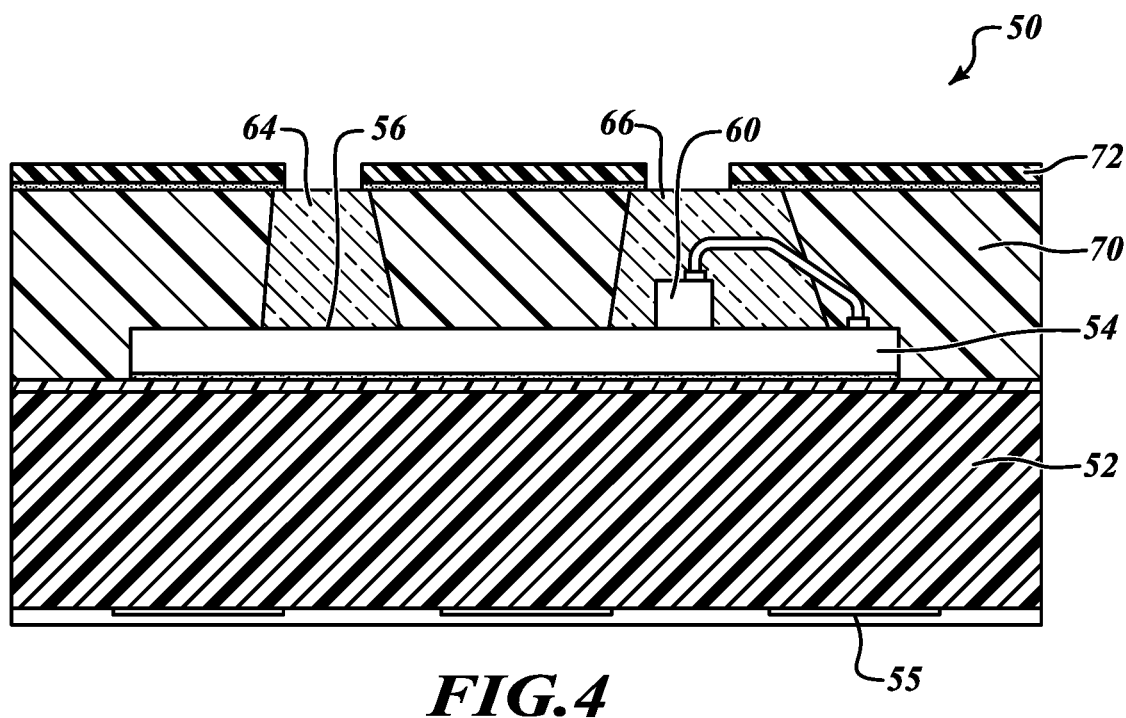
FIG. 4 is a cross-sectional view of one embodiment of the proximity sensor module of FIG. 2 at a final stage in manufacture.

As shown in FIG. 4, after it is cured, the assembly is encapsulated with a molding compound 70 that completely encloses the entire upper assembly, including the light sensor chip 54, the light-emitting diode 66, as well as the lenses 64, 66, and 68. A baffle 72 is attached to the top of the molding compound 70 in order to provide some protection to the overall assembly, although this is not required. Preferably, the baffle 72 has some electrical grounding in order to provide some ESD protection for the proximity sensor module 50. If the proximity sensor module 50 is sufficiently electrically isolated from other components, it may be possible to complete the assembly with just the molding compound 70 alone, and without the use of the baffle or other cover. Alternatively, in some embodiments, a metal cap or metal plate overlies the proximity sensor module 50 as the uppermost layer. The metal cap provides the advantage of good electrical isolation as well as further mechanical support and strength to protect the module as a whole.

FIG. 4 shows a cross-sectional view of the completed proximity sensor module 50. The molding compound 70 fully encases the lenses 64 and 66 as well as the sensor chip 54 and the diode 60.

The completed proximity sensor module 50 includes a baffle 72 overlying the lens assembly in order to provide apertures of the desired opening through each of the lenses 64 and 66. The baffle is attached by some acceptable adhesive, as can be seen in FIG. 4. Electrical contacts 55 provide electrical connection from the light sensor chip 54 to external circuits. The substrate 52 is preferably a printed circuit board which contains a number of insulating layers and traces, as is well known in the art. Electrical contact pads from chip 54 will be electrically connected to contacts in the upper portion of substrate 52, which are then electrically connected to the contact pads 55 at the bottom of the substrate 52. The construction and connection of the printed circuit board 52 to the sensor chip 54 is well known in the art, and therefore the details of the internal electrical traces and the connection of the wires to the contact pads inside the substrate 52 are not shown; however, it will be appreciated that it is a standard printed circuit board of the type which is well known in the art.

Figure 5:
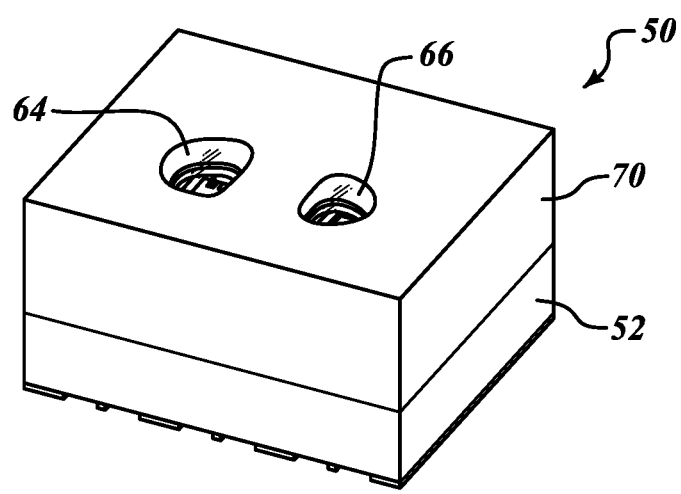
FIG. 5 is an isometric view of an alternative embodiment of a completed proximity sensor module according to the principles as taught herein.

FIG. 5 shows a further alternative embodiment of the proximity sensor 50, according to principles as disclosed herein. In this alternative embodiment, no additional baffle plate 72 is provided. Rather, the uppermost layer of the proximity sensor module 50 is the molding compound 70 which formed the encapsulation layer. The top surface of the lenses 64 and 66 are flush with the top surface of the molding compound 70 because of the final polishing stage, as discussed later herein. In this embodiment, the lenses 64 and 66 will not be exposed to the outside environment, and therefore there is little to no likelihood that the top surfaces would be subject to scratching or wear and tear from the environment. Rather, the proximity sensor module is inside of a cell phone, below an uppermost transparent display layer, and therefore there is no need to have an additional baffle 72 provided. Accordingly, in some embodiments, the baffle 72 is preferred to provide openings of a desired shape and size, and to ensure the block from adjacent portions of the display of the cell phone do not interfere with the proper operation of the proximity sensor. However, in other embodiments, the molding compound 70 is the outermost layer on both the top and sides, as shown in FIG. 5.

Figure 6:
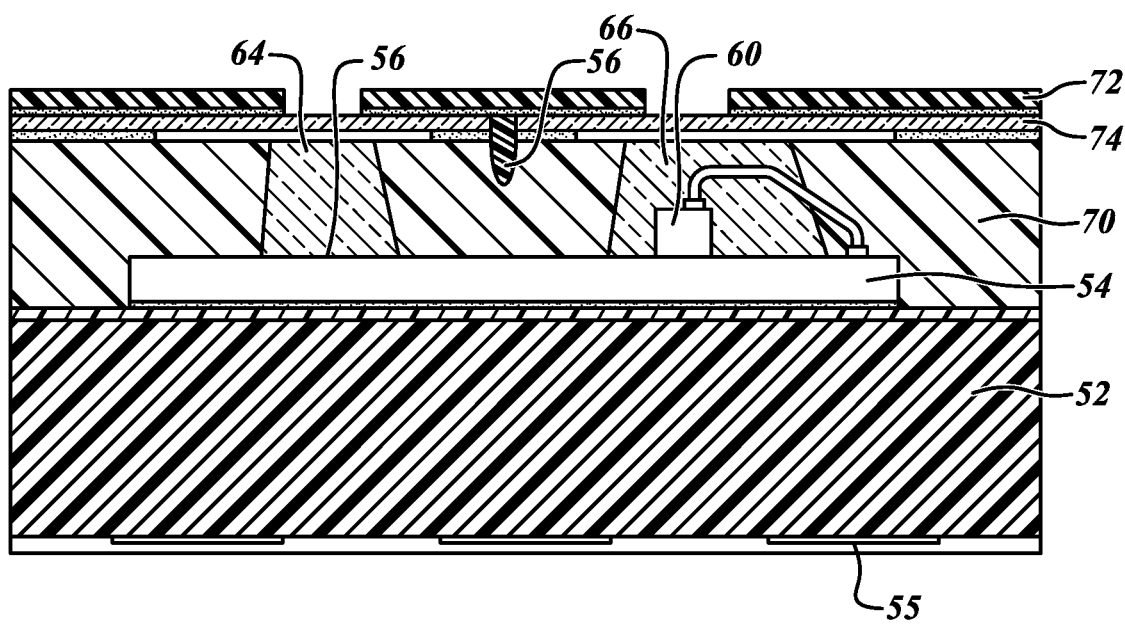
FIG. 6 is a cross-sectional view of an alternative embodiment of a proximity sensor module as taught herein.

FIG. 6 shows an alternative embodiment in which an additional glass lens 74 is provided over the molding compound 70. In those embodiments in which a glass lens 74 is provided, a small cut is made into the molding compound 70 between the light-emitting diode 60 and the light sensor 56, and is filled with the black glue or the opaque adhesive onto which the glass lens 74 is attached, to ensure that all light and cross-talk is blocked that might pass from the light-emitting diode 60 through the glass lens 74 and to the light sensor 56 within the package. Namely, a complete block is made so that only light which leaves the package and bounces off another object can enter the light sensor 56.

The use of the glass 74 is advantageous if a particular color is to be filtered for. For example, if red, green, or blue glass filters are to be used, the glass plate 74 can be the appropriate color filter which provides advantages in some range sensing devices.

FIGS. 7A-7J show the process for the assembly of the proximity sensor module 50 as will now be described.

A starting substrate 52 is provided. The substrate 52 can be a printed circuit board, or any other substrate in which alternating layers of insulator and electrically conductive trace lines can be provided. Various contact pads 80 together with the appropriate insulators 82 therebetween are provided overlying the substrate 52 in order to provide the desired electrical connection to the light sensor chip 54.

The starting substrate 52 is a large substrate that can support an array of proximity sensor modules 50. Thus, many thousands can be assembled simultaneously in a common process sequence and then the packages are singulated, which provides significant advantages over the assembly techniques of the prior art.

Figure 7A:
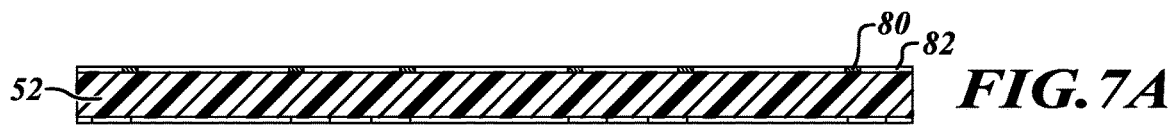
FIGS. 7A-7J show the manufacturing steps of the proximity sensor module.
Figure 7B:
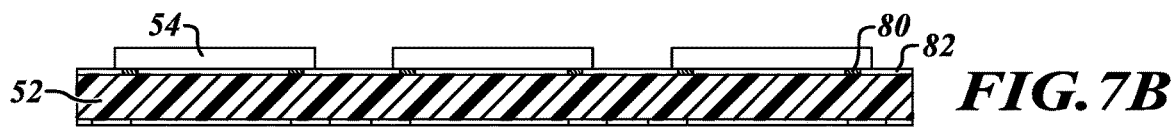

As shown in FIG. 7B, the light sensor chip 54 is attached to the substrate 52 with the appropriate contact pads 80 and insulating layers 82.

Figure 7C:
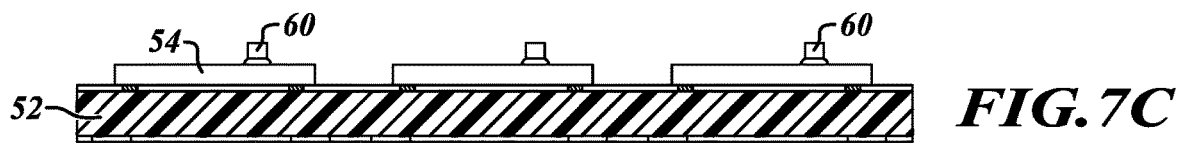

As shown in FIG. 7C, the light-emitting diode 60 is placed directly on top of the light sensing chip 54. It is placed at a location which will not interfere with the light sensor array, and is sufficiently spaced therefrom that when the molding compound encapsulates the chip and diode, it will be assured that there is a blockage completely between them to prevent cross-talk. The light sensor chip 54 contains additional circuitry besides just the light sensing circuitry. For example, it may include a CPU and other logic circuitry which controls the light which is output from the photodiode 60, the light which is received by the light sensor 56, and coordinates the electrical signals to each in order to calculate whether or not another object is proximate to the proximity sensor 50. Such additional electrical circuits in the logic circuitry are well known in the art, and therefore are not disclosed in detail. The diode 60 is placed over the portion of the light sensor chip 54 which contains the logic circuitry. It therefore permits the entire package to be made with a smaller footprint than if the diode 60 were side by side with the sensor array 54 and placed directly on the substrate 52. Further, the wiring layer 54 from the diode 60 goes to the chip 54 and does not go to the substrate 52. The light output from the diode 60 is controlled by the logic circuitry in the light sensor chip 54, which also provides the power. Therefore any connection to the substrate 52 is avoided by the design as disclosed herein. There is a thick passivation layer over the light sensor chip 54 that will mechanically and electrically isolate the circuits that are placed thereon as appropriate. For example, a thick layer of silicon nitride, silicon carbide, or other passivation layer is applied over the entire light sensor chip 54. Then, an aperture to provide a contact pad is etched in the passivation layer to provide electrical contact to the bottom of the LED 60 or, if a laser diode is used, to the VCSEL laser diode 60. Thus, the bottom electrode of the diode 60 is directly connected to a contact pad on the top face of the light sensor chip 54 by providing electrical connection through the passivation layer that overlies the light sensor chip 54. The diode is therefore placed on the light sensor chip 54 at the appropriate location to be electrically connected at its bottom contact pad to the appropriate contact pad of the light sensing chip 54. The top electrode is connected by wire 84 to the appropriate contact pad of the light sensor chip 54 to provide proper operation of the diode 60.

Figure 7D:
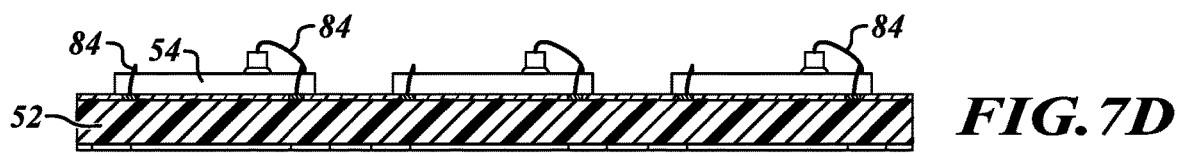

As shown in FIG. 7D, the light-emitting diode is electrically coupled with bonding wires 84 to the light sensor chip 54. Further, the light sensor chip 54 is electrically connected with bonding wires 84 to the appropriate locations in the support substrate 52.

Figure 7E:
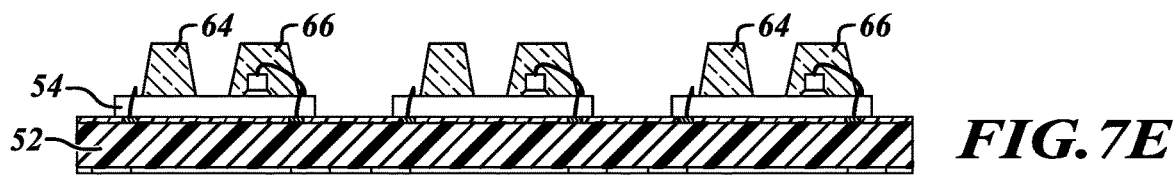

As shown in FIG. 7E, after the light-emitting diode 60 and the light sensor chip are electrically and mechanically connected in place on the substrate 52, a small drop of liquid optical resin is placed over each of these optical components. In particular, a small drop 66 of optical resin is placed over the light-emitting diode 60 and a small drop 64 of optical resin in liquid form is placed over the light sensor 56. The dispensing of one drop of optical resin is easily accomplished using present equipment which is able to deposit a single drop at a precise location. Current glue dispensing machines can be used for the placement of the single drop of optical resin. After the optical resin has been placed over all of the optical components on the proximity sensor module, it is cured as appropriate either by heat, UV light, or other appropriate cure technique depending on the type of optical resin which is used. The shape as shown for the resin drops 64 and 66 may vary slightly depending on the type of resin and its placement with the optical glue dispensing machine. For example, if it has a low viscosity, the liquid drops of the optical resin 64 may, when initially dispensed, be more rounded and in the shape of a drop of water that is beaded up on an oil surface. Alternatively, if a fairly stiff glue is used, which, while still liquid, has a high viscosity, the glue as dispensed from the machine may have a conical shape similar to that shown in 64 and 66. Accordingly, the exact shape of the optical resin as dispensed as a liquid is not critical, but will generally have a conical or rounded shape which completely covers the optical component. In a later stage, the topmost layer of the optical resin 64 and 66 will be polished and buffed, in order to provide a clean light transmission surface.

Figure 7F:
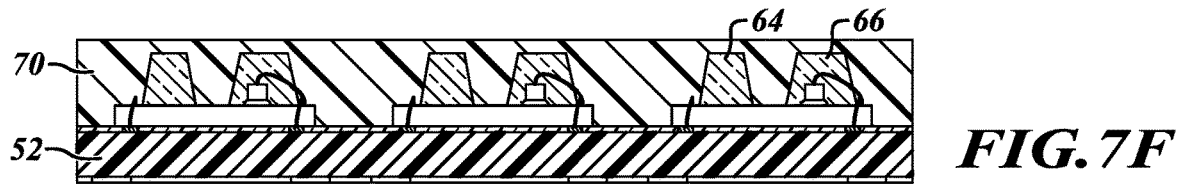

As shown in FIG. 7F, the entire assembly is then placed in a mold and fully encapsulated with a molding compound 70. The molding compound is applied as a liquid and flows completely around the entire proximity sensor assembly that is above the substrate 52. It seals the light sensor chip 54 to the substrate 52, blocking all light which can reach the light sensor directly from the diode 60 unless it goes outside to the package. The molding compound 70 is applied to a sufficient height that it completely covers the drops of optical resin after they have cured. Sufficient molding compound 70 is provided to ensure that the optical resin glue is always completely covered and then there is additional height above it. As can be seen in FIG. 7F, the molding compound 70 may extend 10% or 20% higher than the lenses 66 and 64 to ensure that they are completely covered.

Figure 7G:
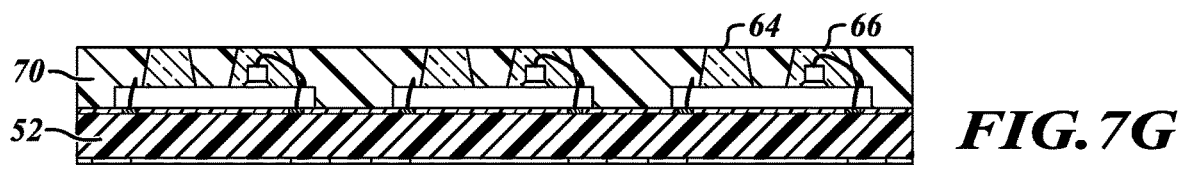

As shown in FIG. 7G, the next step is a polishing of the entire assembly as a single unit. Specifically, the top surface of the proximity sensor module array is ground or polished back to remove the top portion of the molding compound. The removal of the molding compound continues until some portion of the optical resin is exposed, and then the polishing and grinding continues until it is assured that a good portion of the optical resin is exposed to the ambient to permit transmission and reception. The polishing is concluded with a fine buffing step which leaves a high-quality optical surface at the uppermost layer of the optical resin lenses 66 and 64.

The step of applying extra molding compound 70 that is ensured to be sufficient to go above the top of the lenses 66 and 64, and then grinding and/or polishing back the entire assembly provides the advantage that the entire assembly can be encapsulated in a single molding step. Further, the molding compound is assured of completely blocking all light that may travel between the diode 66 and the light sensor 64 within the assembly itself, thus preventing all possible cross-talk. The molding compound 70 is selected to be highly opaque and thus no light can pass through it. Rather, the only way that light can be sensed by the light sensor 56 is if it comes from an outside source. The laser diode 60 must therefore emit light outside of the package and have it be reflected back to be sensed by the sensor 56.

Figure 7H:
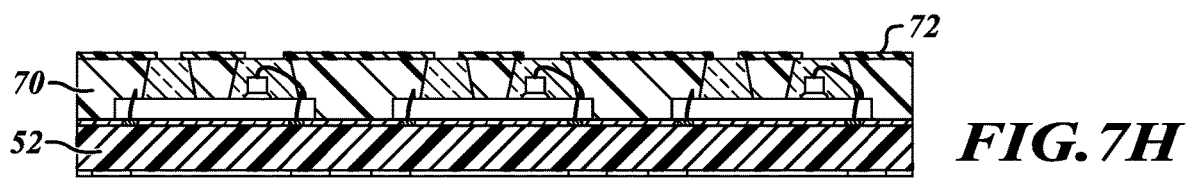

As shown in FIG. 7H, an appropriate protective cover, such as a baffle 72 made of silicon carbide, a metal cap, or the like is applied to the array.

Figure 7I:
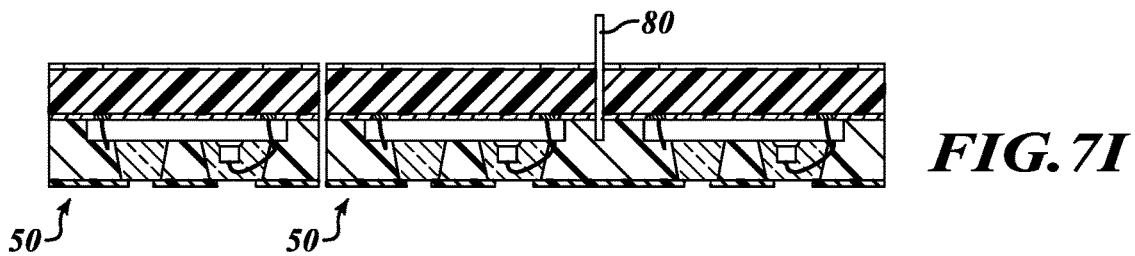

As shown in FIG. 7I, the individual proximity sensor modules are then diced by sawing them between each other to result in individual proximity sensor modules 50.

Figure 7J:
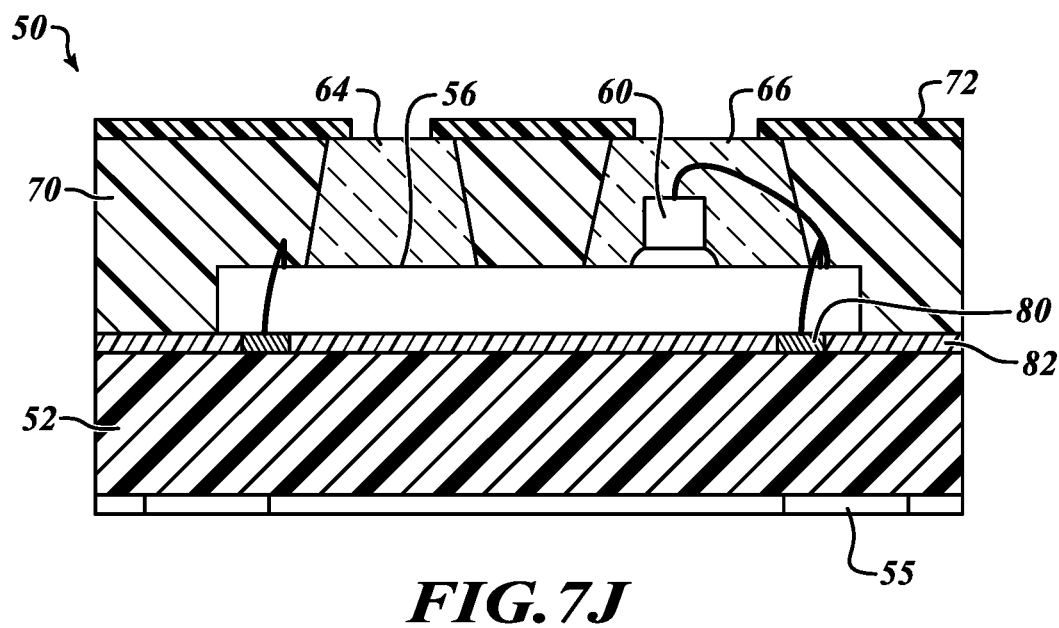

FIG. 7J shows the fully assembled completed individual proximity sensor modules 50 having a molding compound 70 with optical resin glue lenses 64 and 66, as well as the appropriate baffle covering 72, all mounted on a substrate 52.

Figure 8:
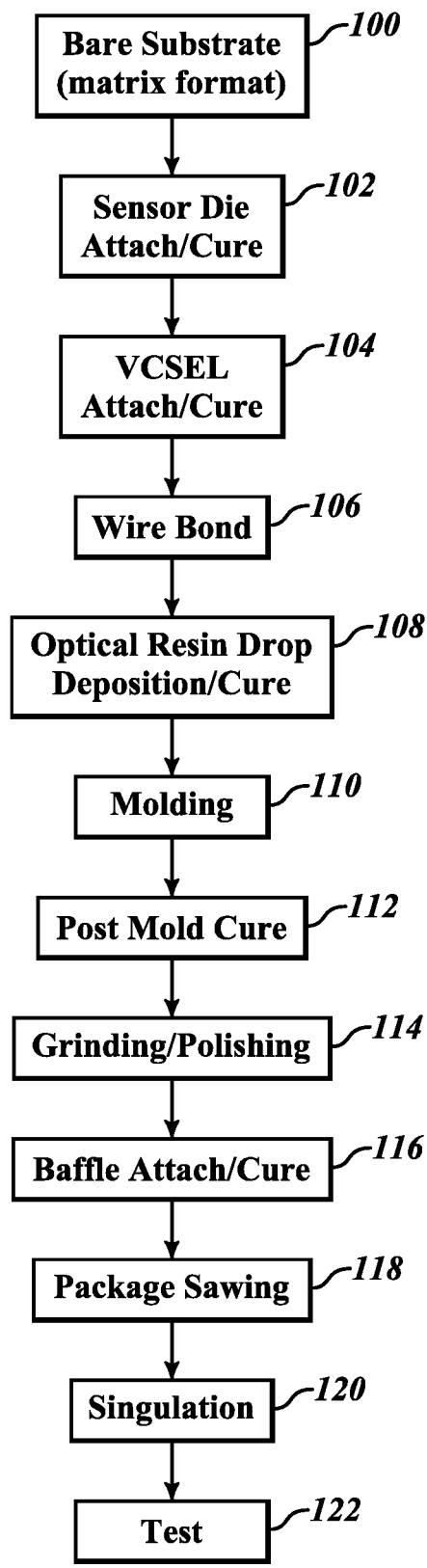
FIG. 8 is a flowchart showing different steps in the method of manufacturing the inventive proximity sensor assembly as disclosed herein.

FIG. 8 shows a flowchart for carrying out the process of manufacturing the proximity sensor module 50. At a first step, a large substrate 52 is provided which has locations for an array of proximity sensor modules 50 to be formed. The appropriate contact pads 80 and insulating layers 82 are then applied to the substrate 52 so that it may receive the light sensor chip 54. In step 102, a plurality of light sensor chips 54 are placed on the substrate 52 aligned with the contact pads 80 which have been previously placed thereon. In step 104, a laser diode, such as a VCSEL laser emitting diode, or other appropriate light source, is attached directly on top of the light sensor 54. In step 106, the entire assembly has wire bonds or other appropriate electrical connections provided.

After the electrical connections are provided, in step 108 an optical resin drop is placed on each of the light-sensitive components, including the light-emitting diode 60, as well as the light sensors 56, as well as any other light sensors, such as ambient light sensor 58 or other light sensors on the chip 54. The optical resin is then cured, resulting in the optical lenses 64 and 66, as shown in FIG. 7E.

At step 110, the entire assembly is placed into a mold cavity, and molding compound flows over the array, completely encapsulating the entire array and extending some height above the lenses 64 and 66.

As shown in step 112, the molding compound is cured with the appropriate curing, whether by heat, exposure to air, UV, or the light. In step 114, the entire upper layer of the assembly is polished or ground in order to expose the lenses 64 and 66. In particular, a blanket polishing takes place over the entire assembly array to uniformly remove the molding compound 70 as well as to expose or remove portions of the optical resin glue 64 and 66. The polishing continues until a relatively large area of the optical resin is exposed. The optical resin is therefore assured of having a top surface that is flush with the top surface of the molding compound 70.

In step 116, the appropriate cover is provided, such as a baffle 72, a metal plate that provides grounding, or other appropriate cover in order to provide mechanical as well as electrical isolation of the proximity sensor module 50. One acceptable baffle material is silicon carbide, which may be applied as a blanket layer across the entire array and then etched at the appropriate locations to expose the lenses. This is a low-cost method of providing a cover layer. The upper portion of the silicon carbide can be electrically conductive in order to prevent stray charges from causing damage to the proximity sensor module 50.

In step 118, the array is singulated by cutting with a saw blade in order to obtain individual assemblies 50.

FIG. 7J shows the fully assembled and completed proximity sensor module 50, which corresponds to that shown in FIG. 4. In particular, the light sensor chip 54 is mounted on a substrate 52, and an encapsulation layer 70 of molding compound completely encases all four sides, as well as the top of the light sensor chips 54. Further, the molding compound fills all the spaces between the light-emitting diode 66 and the light sensor 64. The appropriate protection baffle 72 is then added, which has an aperture either provided in advanced or etched therein, so that light may exit from the light-emitting diode 60 and be received by the light sensor array 56 in order to carry out the proximity sensing function.

In one embodiment, the optical resin glue may have a small amount of color added therein while it is in liquid form. The color can provide the function of filtering certain types of light in order to perform specific functions in the light sensing.

Figure 9:
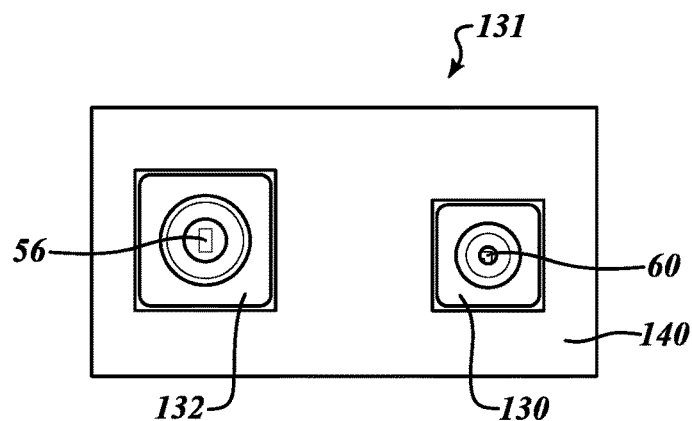
FIG. 9 is a top plan view of an alternative embodiment of the proximity sensor model.
Figure 10:
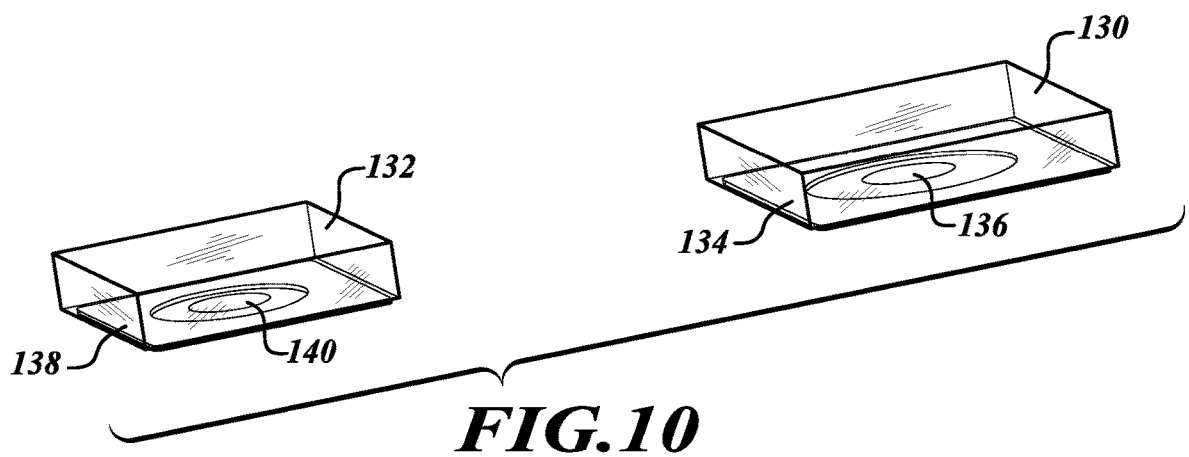
FIG. 10 is an isometric view of the lenses for use in the alternative embodiment.
Figure 11:
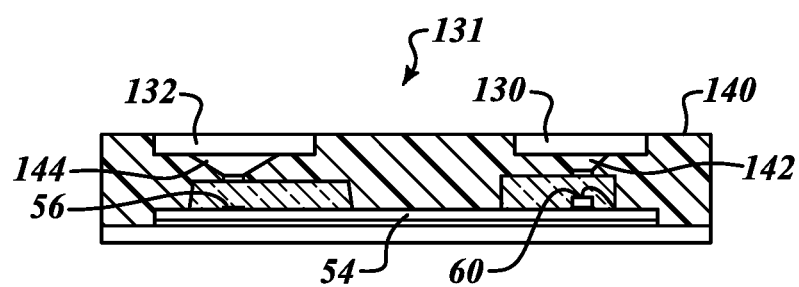
FIG. 11 is a cross-sectional view of the package of FIG. 9.

FIGS. 9-11 provide an alternative embodiment for carrying out the concepts as newly disclosed herein. In particular, FIGS. 9-11 illustrate an embodiment of a proximity sensor 131 in which an open space and a glass lens have been added above the optical resin glue. As shown in the first embodiment of FIG. 3, the small drop of optical resin is placed directly over the light-emitting diode 60 and the light sensor 56. Then, differently from the embodiment of FIGS. 4-8, a mold cavity having a step shape over the LED 60 is used which forms the molding material leaving a space for a glass member to be placed directly over the optical resin. See FIG. 11.

FIG. 9 shows a top side view of a glass element 130 positioned directly over the light-emitting diode 60 and a glass element 132 positioned directly over the light sensor 56. These glass elements 130 and 132 are made of selected glass material to have high transmission of the type of light to be emitted by the light emitting diode 60 and the type of light to be received by the light sensor 56. Further, the bottom of the glass has a pattern printed thereon to further define and focus the transmitted beam so that it is properly transmitted in a desired pattern and to limit the receiving field of view so as to reduce the ingress of unwanted ambient light. Additionally, filters can be placed thereon in order to filter ambient light but pass at nearly full luminosity the type of light emitted by the LED 60.

In particular, the glass lenses 130 and 132 are overlaid on top of the optical resin dots 64 and 66. The optical resin captures the light, and is a low-cost, rapid technique to ensure that the optical element, such as the LED 60 and the light sensor 56, are properly protected; however, the optical resin may not have sufficient qualities to be the type of lens needed. Accordingly, by providing an additional glass lens, which is customized to the exact shape and optical properties needed, the light can be assured to be transmitted in the correct pattern out of the LED 60. The glass lens 32 can have the correct shape and pattern in order to be assured of receiving the signal from the LED 60. In addition, this permits the light to be filtered through two sequential filters, first an optical resin filter that can be made of a selective color to filter certain types of light, both as emitted by the LED 60 and to be received by the light sensor 56, and also, using the lenses 130 and 132, which can also have different types of light filters, such as to filter ambient light, different colors of light, or different shapes, as will now be explained.

FIG. 10 shows examples of the particular glass elements 130 and 132. As can be seen, the glass element 132 has printed thereon a pattern 134 which has a large aperture that will define the emission location of the transmit beam out of the light source 60. Further, the printed pattern 134 can shape the beam to a desired shape so that with a simple printed pattern, such as a type made by a silkscreen printer, the beam is more effectively shaped for transmission to be received by the light sensor 56. Preferably, the aperture 136 of the light emitting glass 130 is relatively large in order to bring in a large amount of light to be emitted by the light source 60. The glass can be antireflective and tuned to pass infrared, laser, ultraviolet, or the type of glass, depending on the particular source used for the light emission 60. Similarly, glass 132, which is positioned over the light sensor 56, includes a pattern 138 on the bottom of which is an aperture of the desired shape. This aperture 140 is somewhat small and is shaped to limit the amount of light which is able to enter the light receiving field of view. The shape selected for the pattern 138 and aperture 140 reduces the amount of unwanted ambient light that can reach the sensor 56. Further, in one embodiment, the type of glass selected for the light sensor glass 132 is selected to substantially block standard ambient light that may come from indoor lighting of the type in which a cell phone is normally used, such as fluorescent light, incandescent light bulbs, and the like, and permit passage of the type of light that is emitted by the light source 60. Thus, if the light source 60 is emitting infrared light, the glass will be tuned to pass infrared light with little attenuation while blocking the light of normal visible frequencies. The lensing surface will therefore define the field of view of the received array 56 of the light sensor.

FIG. 11 shows a side cross-sectional view of the proximity sensor 131 package having the glass lenses 130 and 132 over the optical resin. As can be seen in FIG. 11, the glass lenses 130 and 132 extend over the optical resin 66 and 64, respectively. There is an air gap 142 and 144, respectively, between the optical resin and the lenses 130 and 132.

The air gap 142 and 144 between the optical resin and the glass lenses provides an additional optical shaping property. The top of the optical resin can be concave, convex, or flat. Similarly, the bottom of the glass lenses 130 and 132 can either be concave, convex, flat, or some other shape. The air gap 142 and 144 between these two optical lenses permits the shape of each to be made independent of the other without having to redesign either of them for each custom use. For example, in some uses, the bottom of the lenses 130 and 132 may be concave, while they may be convex in others. By leaving an air gap 144 and 142, the package can be a universal package that can have many different lens shapes applied. Therefore it can be mass produced for many different customers, and then the individual customer that provides the particular lens 130 and 132 can do so of any shape, size, and dimensions they desire.

Figure 12:
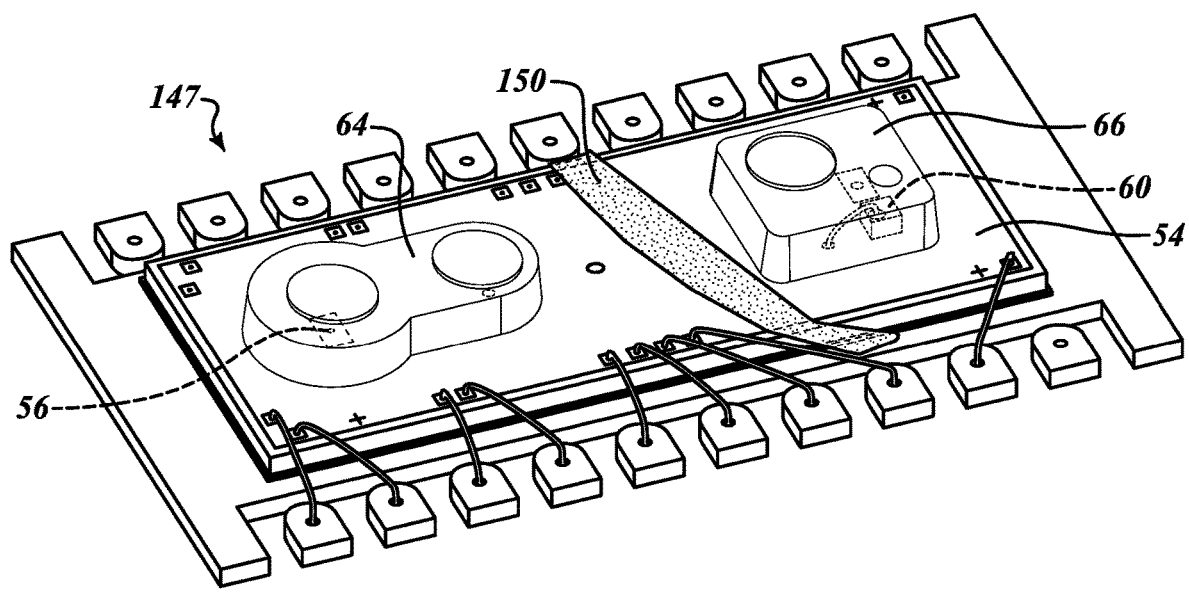
FIG. 12 is an alternative embodiment of the package of FIG. 9 having a blocking member overlying the substrate at a position between the light and the sensor.

FIG. 12 shows that an additional member, a central glue stopper 150, has been added in-between the LED 60 and the light sensor 56 for another embodiment of the proximity sensor 147. This central glue stopper 150 directly overlays and is in contact with the uppermost surface of the semiconductor substrate die 54. This central glue stopper is provided in order to avoid damage to the sensor die surface. In particular, the semiconductor die 54 has a number of integrated circuits, processors, optical analyzers, and other transistor-based logic circuits therein. The circuits to drive the LED 60 are located in the integrated circuit 54, as well as the sensors and processors to analyze the signal returned from the light sensor 56. In order to avoid damage to the sensor die 54, it is helpful to ensure that the mold cavity, which is going to be in place to produce the molding compound 70 that will encase the entire package, does not touch the die surface. Accordingly, a small gap is provided in the mold cavity to ensure that the mold tool does not impact, and thus potentially damage, the die 54 when the mold is closed. However, if there is a small gap, there is some risk that the molding compound will leak outside the edges of the die, and also a complete blocking member may not be formed. Accordingly, as an option to prevent the crosstalk of lenses 1 and 2 through an optical path, black glue may be dispensed as a stopper layer to avoid having crosstalk of the light beam. The central stopper black glue height is selected to be sufficiently high to prevent the mold cavity from contacting the semiconductor die 54. Its height is selected to be higher than a silicone skin that may be placed over the semiconductor 54.

Figure 13A:
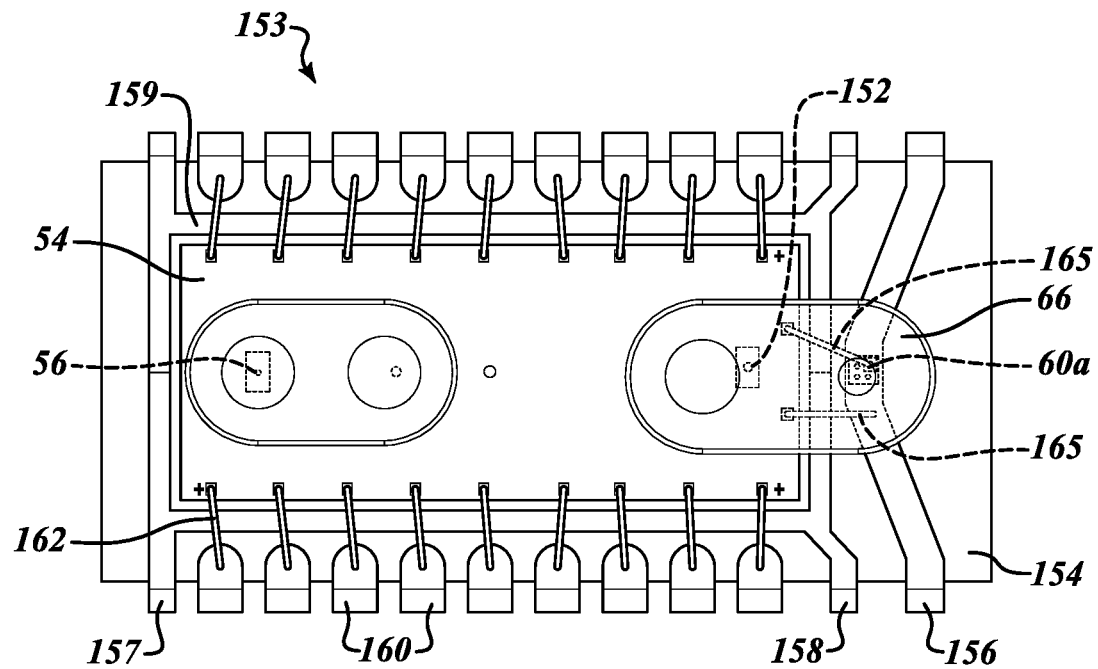
FIGS. 13A and 13B are views of an alternative embodiment having the LED mounted on a separate lead.
Figure 13B:
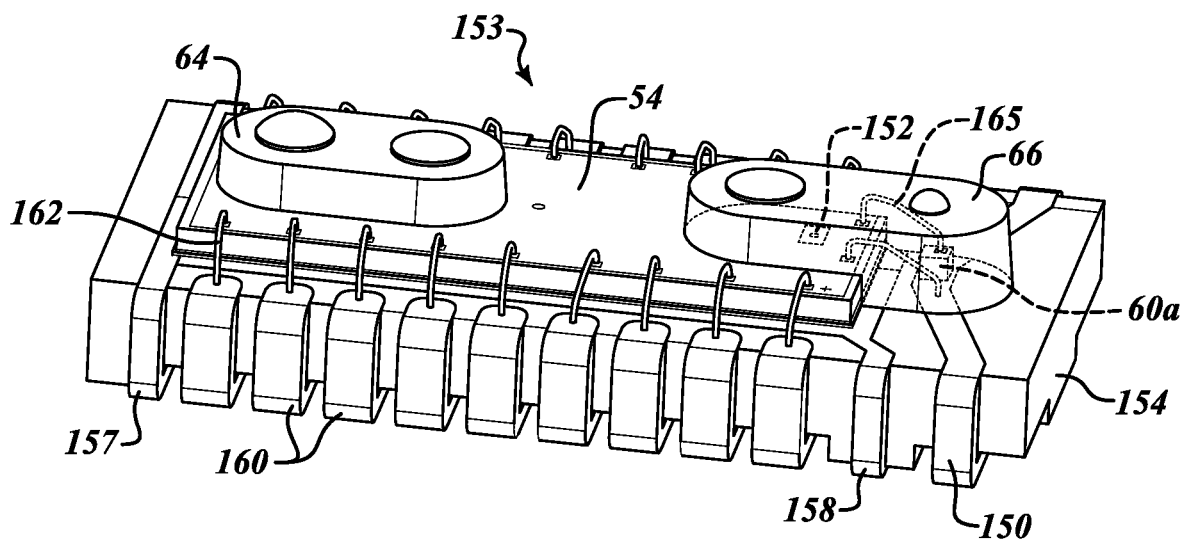

FIGS. 13A and 13B show another alternative embodiment of a single package having a light emitter 60 and one or more light sensors 56. The particular embodiment of FIGS. 13A and 13B has a light emitter, such as an LED 60a positioned on its own conductive lead 156. In particular, the inventive package 153 contains a laminated insulated carrier substrate 154 having a plurality of leads wrapped therearound. The leads include conductive leads 160, a lead frame 158, and an LED lead 156. The lead frame 158 is a single metallic piece which is wrapped around the sides of the laminated substrate 154 and has a die pad 159 on which the integrated circuit die 54 sits. The lead frame includes leads 157 at either end of the lead frame, both of which wrap around the sides and bottom of the laminated substrate 154. In most embodiments, these will be coupled to ground to provide a solid ground connection for the back plane of the integrated circuit die 54. A separate metal lead 156, which is mechanically and electrically isolated from the lead frame 158, also wraps around the same laminated substrate 154. A light source 60a, such as an LED, is mounted on the lead 156. It is the only element mounted on this lead. Accordingly, the entire lead 156 can be placed at a desired voltage in order to properly drive the LED 60. As can be seen in FIGS. 13A and 13B, lead wires 165 extend from the integrated circuit 54 to the LED 60a to provide the electrical signals to drive the diode in the desired sequence and intensity.

The integrated circuit die 54 contains two light sensors: a data light sensor 56, and a reference light sensor 152. Their use and construction will now be explained. An optical resin 66 overlays the LED 60a and encases the bonding wires 165. A first light sensor 152 is located on the integrated circuit 54. The light sensor 152 is within the same optical resin as the LED 60a, and therefore receives light each time the LED 168 is illuminated. Further, the reference light sensor 152 is on the same semiconductor substrate 54 as the data light sensor 56.

The reference light sensor 152 and the data light sensor 56 operate as follows. The reference light sensor 152 is able to sense ambient light at all times and thus can register the result of all changes of ambient light. In addition, each time the LED 60a is illuminated, the reference light sensor 152 receives the light. Accordingly, this provides a reference signal that can be used to determine whether or not the data light sensor 56 has received the same light. Both light sensors 156 and 152 are on the same integrated circuit die and preferably have been made identical using the same process steps, and are of the same size with identical operating parameters. Accordingly, the only difference in the signal received from them will be whether or not they have each received any illumination from the LED 60a.

The signal that is output by the reference sensor 152 can be compared to the signal output by the data sensor 56. If the LED 60 is off, then both sensors should have the same output. The reference sensor 152 can therefore be used as a calibration sensor, and the output from a comparison between them can be set to zero when the conditions received at both are identical. Then, when the sensor is in use, the LED 60a is illuminated. If there is not a reflective object adjacent to the proximity sensor 153, then the LED 60 will illuminate the reference light source 152, but little or none of the light will be received by the data light sensor 56. On those instances in which there is an object closely adjacent to the proximity sensor 153, then the light which is emitted by the LED 60a will hit the adjacent object and be reflected back towards the die 54 and will be received by the data light sensor 56. In this instance, the type of light received by the data light sensor 56 will be similar to the type of light received by the reference light sensor 152. Even though the amplitude and intensity of the light will be somewhat different at the data light sensor 56 than at the reference sensor 152, it will still contain the same wavelength of light and, in the event it is a laser-type diode, have similar optical properties to the light which is being sensed at the reference light sensor 152. Accordingly, the circuit can determine that the light received at the data sensor 56 has been output by the LED 60a and not by some other source. It can therefore be a more reliable proximity sensor. Further, it will be much more accurate for positive results and avoid false negatives.

The particular structure of the proximity sensor 153 is advantageous because flat leads extend around the outer edges as well as the bottom of the package, as can be seen by the shape and construction of leads 156, 157, 158, and 160. Thus, electrical connection can be made to the proximity sensor package 153 by connecting to either the sides or the bottom of the respective leads, as appropriate for the particular design in which the product is used.

Figure 14:
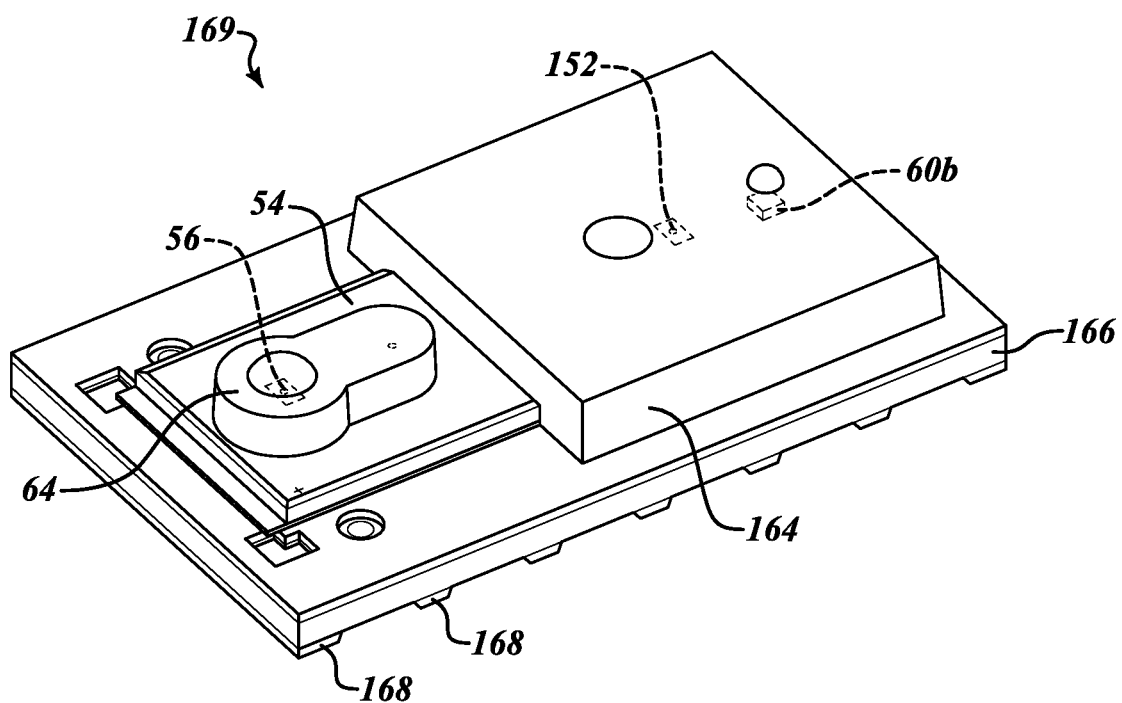
FIG. 14 illustrates an optical overmold layer overlying bonding wires and the light emitting diode of the embodiment of FIGS. 13A and 13B.

FIG. 14 illustrates yet another embodiment of a proximity sensor 169. In this particular embodiment, a flat laminated substrate 166 is provided having a plurality of metallic leads 168 across the bottom thereof. This particular package 169 does not have any leads that wrap around the top or the edges; rather, all electrical connection is through various traces and conductive lines within the laminated substrate 166 to the bottom contact leads 168. This proximity sensor module 169 has the laminated substrate as a base on which one or more integrated circuits 54 are positioned. In this embodiment, a light source 60b is positioned on a conductive strip extending at a top region of the substrate 166. This strip can be an exposed copper contact plate which has been provided using well-known techniques for exposing copper contact plates as used in printed circuit boards, or other technique. A single large overmold completely encases one end of the integrated circuit die 54, which includes the bonding wires. In particular, the optical overmold 164 extends off one or both sides of the semiconductor die 54 in order to encapsulate the wire bonds. The wire bonds are not shown because they are within the encapsulated section 164. The semiconductor die 54 has all of the wire bonds located just at one end, and internal routing of the conductive wires is made in various layers in order to ensure that no wire bonds need to be at the end that includes the data light sensor 56. The data light sensor 56 includes an optical resin 64 which encloses it and overlays the portion of the semiconductor die 54.

FIGS. 15A-15H illustrate a sequence of steps in the manufacture of the proximity sensor 131, as shown in FIGS. 9-11. Slight variations can be made to these steps as discussed here in order to make the embodiments of FIGS. 12, 13A, 13B, and 14, as will be explained at various stages herein. FIGS. 15A-15H will be described in combination with the method steps shown in FIG. 16 for ease of understanding.

Figure 15A:
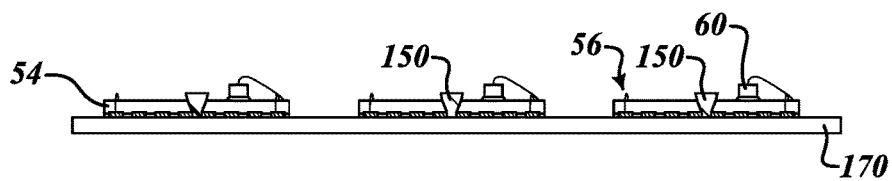
FIGS. 15A-15H illustrate a sequence of steps that may be followed in the formation of the device as shown in FIGS. 9-11.
Figure 15B:
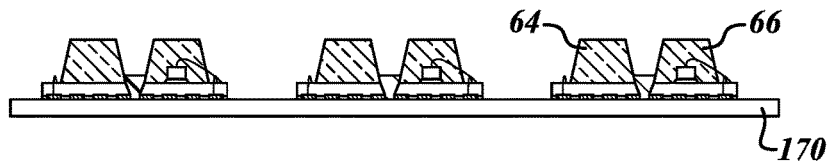
Figure 15C:
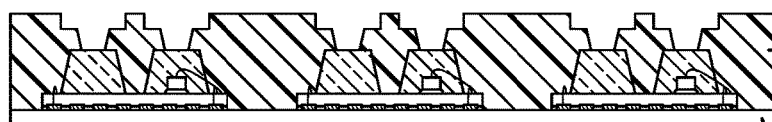
Figure 15D:
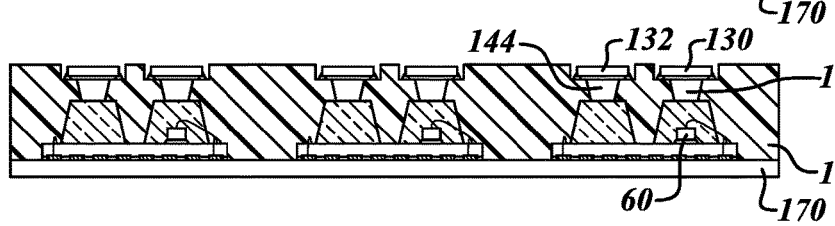
Figure 15E:
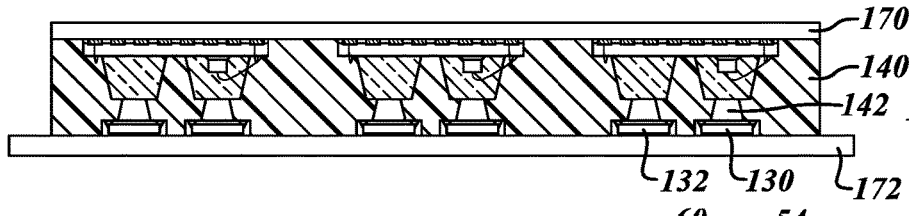
Figure 15F:
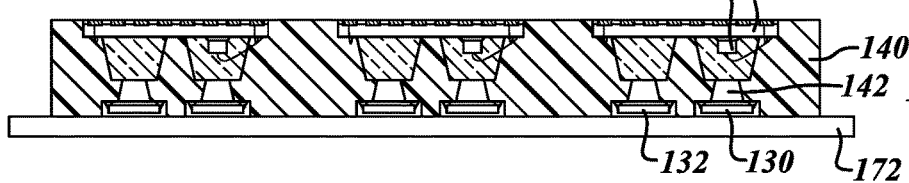
Figure 15G:
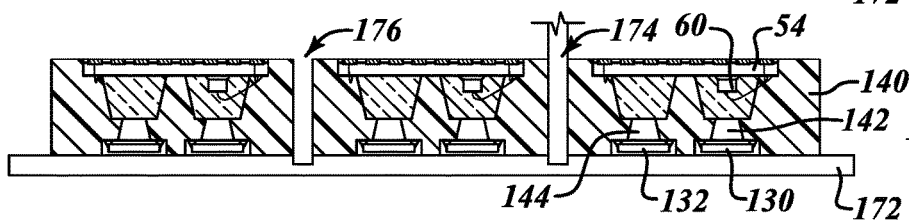
Figure 15H:
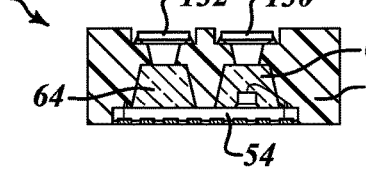
Figure 16:
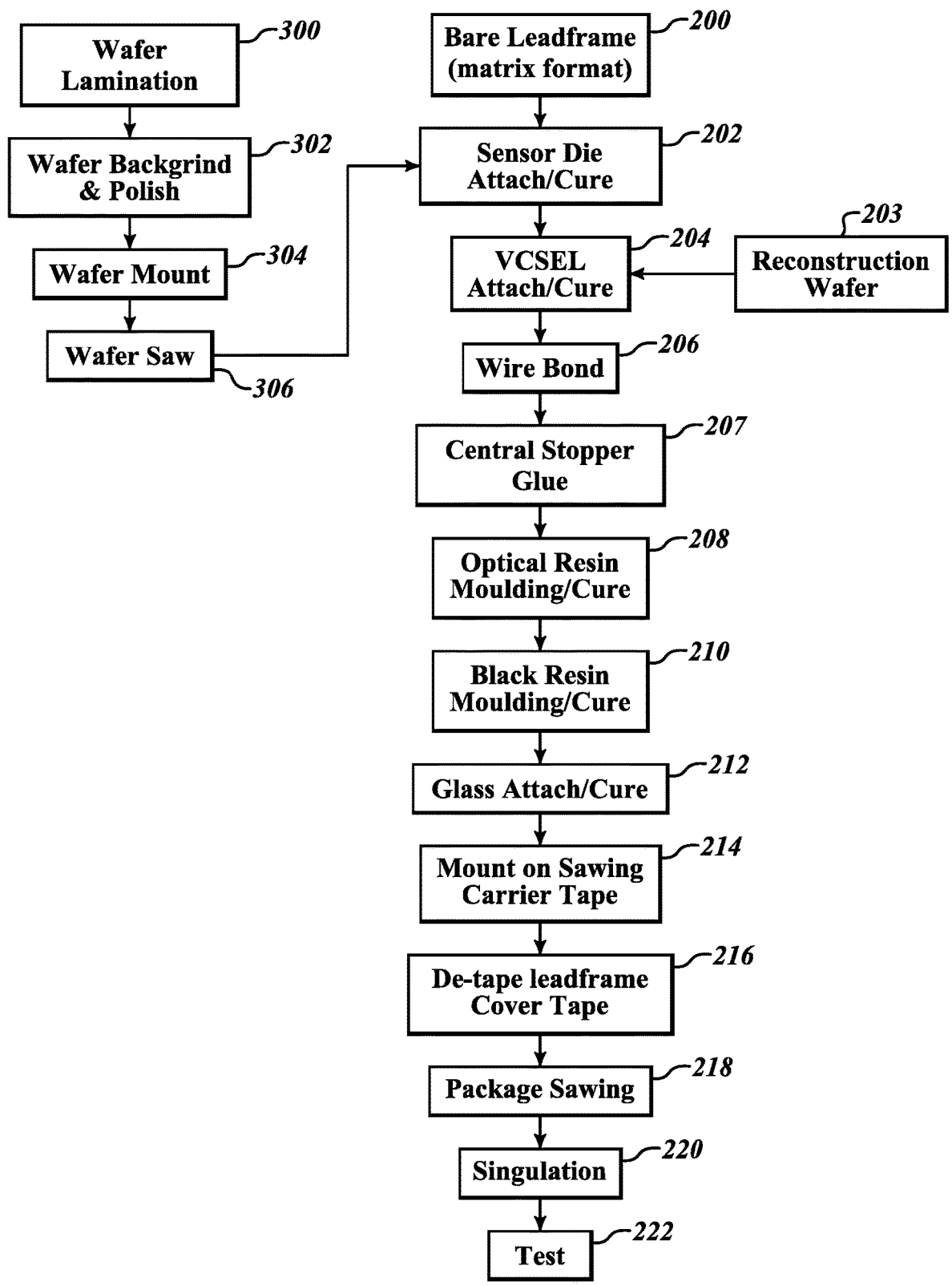
FIG. 16 is a flowchart illustrating some of the steps carried out in forming the device of FIGS. 9-11.

Referring jointly to FIGS. 15A-15H and 16, a first step in the manufacture of the proximity sensor 131 is to begin with a bare lead frame in step 200. In a different processing sequence, in a different location, a semiconductor die 54 is constructed. This begins with the step of wafer lamination 300, as shown in FIG. 16, the wafer manufacture, which includes a back grind and polish as shown in step 302, and then the mounting of the wafer on the appropriate substrate for singulation. The wafer is singulated in step 306 in order to obtain the individual die 54, as shown in FIG. 15A. The die 54 is thereafter mounted on a lead frame, and the combination is then mounted in step 202 to a support substrate 170.

In a different location, the LED 60 is manufactured. This is generally carried out with a reconstruction wafer of a plurality of LEDs in step 203, as shown in FIG. 16. The LED 60s are constructed using known techniques, diced and then attached to the top of the die 54 in step 204, as shown in FIG. 16. The semiconductor die 54 and LED 60 are wire bonded to each other and to the lead frame in step 206. A black glue layer 150 is then applied across the top of the semiconductor die 54, in step 207. The support substrate 170 holds three examples of the proximity sensor 131 at this stage of the construction, corresponding to step 207 of FIG. 16.

While the black glue layer 150 is not required, it is preferred in those embodiments in which a mold cavity is used having a clamshell mold that closes thereover in a particular shape.

Subsequently, in step 208, a small amount of optical resin is placed overlying the LED 60 and the light sensor 56. The optical resin 64 covers the light sensor 56, while optical resin 66 covers the LED 60. Next, in step 210, as shown in FIG. 15C and 16, a mold is placed over the assembly of proximity sensors 153. After the mold is placed over it an encapsulating compound, molding compound, or the appropriate encapsulant 140 is injected into the mold an cured to have the shape as shown in FIG. 15C. The mold has a shape to provide an open space directly above the optical resins 64 and 66, and then a flange in the appropriate shape in order to support glass lenses 130 and 132. In particular, as shown in FIG. 15D and step 212, glass lenses 130 and 132 are attached by the appropriate adhesive, which is then cured to rigidly fix them directly to an exposed flange of the encapsulant 140. When they are attached to the encapsulant 140, and open air space 142 and 144, respectively, is left over the LED and the light sensor optical resins. The lenses 130 and 132 seal on all edges so that no dust or debris can collect in the spaces 142 and 144. In one embodiment, they are sealed while under vacuum to ensure that not dust or debris may enter the space, while in other embodiments they are sealed while the process is in clean, ambient air, also assuring that no dust or dirt can interfere with the optical operation of the proximity sensor 131. Next, the assembly is mounted on a sawing carrier tape 172 in step 214. This is done by inverting the substrate 170, which contains the plurality of proximity sensors 131 and then supporting it on the sawing carrier tape 172. The support substrate 70 is then removed by the appropriate means, whether grinding, chemical wet etch, polish, or the appropriate removal technique. This leaves the metal leads coupled to the semiconductor die 54 exposed as the uppermost layer, as shown in FIG. 15F, and in step 216 of FIG. 16. Next, the proximity sensors 131 are singulated by cutting through the encapsulant 140 with a saw 174 at each of the proximity sensors. In particular, the saw 174 will cut an aperture 176 which is completely through the encapsulant molding compound 140, and partially through the sawing carrier tape 172. The sawing carrier tape 172 still remains sufficient mechanical strength to hold the assembly together, and all of the individual proximity sensors 131 are singulated. After this, the sawing carrier tape 172 is removed by any appropriate technique, whether chemical etch, grinding, dissolving in water, peeling away, or other appropriate technique. The proximity sensors 131 are therefore singulated as shown in FIG. 15H and then tested for shipment to the customers.

Figure 17:
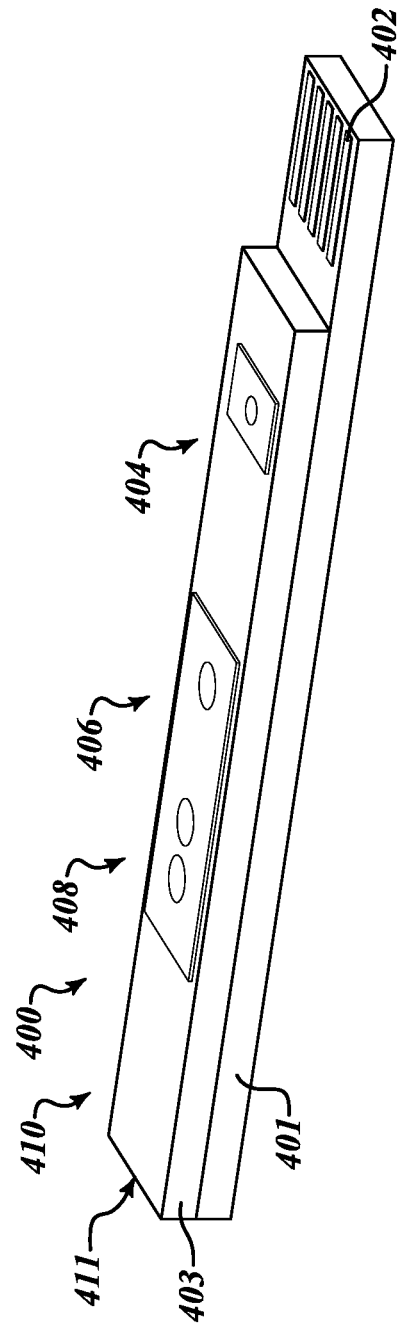
FIG. 17 is an isometric view of a mobile sensor stick having a plurality of sensors thereon.

FIGS. 17-21 illustrate another embodiment of various sensors. As shown in FIG. 17, a sensor stick 400 is in the form of a small microstick having metal contact leads 402 at one end thereof and a form factor similar to that of a memory stick. In particular, the leads 402 are of a configuration compatible with most computers, such as a USB port, a digital card, a micro SD card, an SDHC card, or the like. The sensor stick 400 includes a plurality of sensors all mounted on a common substrate and electrically connected to the contact pads 402 for insertion into any computing device. The sensors on sensor stick 400 include environmental sensors 404, ambient light sensors or projectors 406, proximity sensors 408, motion sensors 410, as well as other communication sensors such as Bluetooth, Wi-Fi chips, and other wireless connectivity chips according to any acceptable protocol for wireless communication. Each of these sensors are appropriately supported by the printed board substrate 401, and enclosed with an encapsulant or molding compound 403. The details of the various sensors, as well as their construction, and other operational details will now be disclosed and explained relative to FIGS. 18A-21.

As shown in FIG. 18A, the sensor stick 400 includes a printed board circuit substrate 401 having a plurality of leads 412 positioned therein, with conductive layers alternating with insulating layers, as is well known in the art of PCBs. At one end of the PCB 401, a plurality of leads 402 are provided that electrically connect to one or more of the circuits on the substrate 401. While the contact pads 402 in this particular cross section are not shown as connecting to each of the sensors 404-410, it will be appreciated that such connections are made in the various layers and in planes other than that shown in the cross section of FIG. 18A.

One type of sensor on the sensor stick 400 is an environmental sensor 404. This environmental sensor 404 is distinguished by the requirement that it be exposed to the ambient air in order to sense the environment around the sensor. In most instances, this will mean that the sensor is also exposed to the ambient light and temperature, though in some types of sensors, it is sufficient that the environmental sensor 404 be exposed to the ambient air and may have the appropriate cover thereon with apertures therein so it is not exposed to light. It may also be somewhat temperature isolated or have its own heater so that its temperature is different than that of the local temperature. However, in most embodiments, the environmental sensor 404 will be exposed to the ambient atmosphere. This ambient sensor 404 includes a semiconductor die 412 having the appropriate ambient sensor 414 mounted thereon. The ambient sensors may include sensors capable of sensing for a particular gas, such as CO, $CO_2$, methane, or other gas for which sensing small quantities of gas is particularly beneficial. In addition, the environmental sensor 404 may include, in addition to or instead of a gas sensor, a UV light sensor, an infrared light sensor, a temperature sensor, humidity sensors, air pressure sensors, and the like. While only a single environmental sensor 404 is shown in the cross-sectional view of FIG. 18A, the topside schematic view of FIG. 18B gives an example of the type of sensors which may be organized along the sensor stick 400. Namely, at one end thereof are the contacts 402, and electrically connected and stretching along the length of the substrate 401, are one or more of the appropriate environmental sensors in the example of FIG. 18B. The examples include methane, $CO_2$, CO, IR, UV, humidity, temperature, and pressure. The sensor stick 400 may have only one of these environmental sensors, or in one embodiment it may include all such environmental sensors on a single memory stick. Next will be a light emitter and/or a light sensor 406. In one embodiment, the light emitter 406 is a mini-projector which has a plurality of micro-mirrors therein and, once the sensor stick 400 is inserted into a computer, it receives power so that a small amount of light in a mini-display may be projected out of the memory stick. Single chips that are capable of providing the projection of a viewable image are known, and such a micro-mirror chip may be mounted at location 406 on this sensor stick 400, as shown in FIG. 18B. Alternatively, or in place of the light emitter 406, one or more ambient light sensors 408 and/or proximity sensors 408 may be provided. The sensors 408 may sense ambient light and may also sense whether the sensor stick 400 is closely adjacent to another object and therefore may include the proximity sensors 408, ranging sensors to measure the distance, and other appropriate sensors therein within the same substrate and adjacent to the other sensors. The proximity sensor 408, which may include a ranging sensor and ambient light sensor, may be constructed along the lines of the embodiment shown herein with respect to FIGS. 1-16, and then connected to this sensor stick using the appropriate connecting technology as is known in the art.

Also included on the sensor stick 400 are various motion sensors 410. In one embodiment, the motion sensors 410 may include a magnetometer 410a, a gyroscope 410b, or an accelerometer 410c. Other types of motion sensors may also be included. Adjacent to, either on the same die, or mounted on a similar interposer board, the wireless connectivity circuits 411 may also be mounted, as shown in FIGS. 18A and 18B. In particular, at one end of the sensor stick 400 can be a plurality of wireless connectivity circuits which may include Bluetooth, Wi-Fi, NFC, IR communication protocols, or other optical communication protocols. In particular, the sensor stick 400 can be connected by two different techniques to a user's local computing device. It can be connected as a wired device with contact pads 402 in the appropriate patterns, such as for a USB, SD card, or the like. It can receive power through this source in order to power each of the sensors mounted on the sensor stick 400. In addition, the power can also provide the drive power for any wireless connections, such as via Bluetooth, Wi-Fi, and the like as described herein. Thus, it can communicate with the computer to which it is connected via the hardwire connections through contacts 402, while at the same time coupling wirelessly to the same computer via a wireless route so the data may be provided by two independent techniques, or alternatively it can be connected wirelessly to another computing device and provide data to multiple computing devices. It can provide the same data simultaneously to two or more different computing devices. It can provide the data via the hardwire contacts 402 to the computing device to which it is plugged in the socket, while at the same time providing the same identical data to one or more computing devices to which it is connected wirelessly. Yet, it has no battery. So it uses the power provided to it by one computer to receive, analyze and organize data, then send it wirelessly to another computer.

The current embodiment has the benefit of providing a user-selectable array of sensors which they may obtain and then connect to a computing device of their choice. For example, a user may desire to have one or more environmental sensors that work easily and smoothly with their cell phone, an iPad, or other microcomputer. Rather than being forced to buy a low-cost cell phone which contains all of these sensors, the user can buy a sensor stick 400 having the particular sensor configuration which they desire. They can thereafter plug the sensor stick into the computing device, such as a cell phone, and automatically provide a wide range of additional sensing capability. In one preferred embodiment, the computing device is the user's cell phone. The user's cell phone, which has a large amount of computing power within the cell phone itself, together with the battery, can therefore be used to power, collect data from and interact with the various environmental sensors 404, project one or more images using projector 406, as well as sense motion and perform other activities according to those which are provided on the sensor stick 400. The user can therefore buy a lower-cost cell phone which does not have any of these particular sensors, and then buy the particular sensor stick which meets their needs, and thus, by inserting it into the USB slot of the cell phone, can turn the cell phone into a high-quality environmental sensor in a very short period of time. If the user decided to use a lower-cost sensing stick 400, they can buy one that has only one or two sensors on it, and can carefully those to maximize the ones which they would use for the most economical cost package. The sensor stick 400 is also fully portable to other devices.

FIG. 19 illustrates another alternative embodiment of the sensor stick 400. In this embodiment, two environmental sensors are shown side by side, one for sensing methane and the other for sensing $CO_2$. Thus, as can be seen, it is possible to have mounted side by side, either linearly or in parallel, two or more environmental gas sensors on the same substrate. These can be physically isolated from the encapsulation layer 403, as shown in FIG. 19, having their own case 417, or, alternatively, can be within the same encapsulant 403 as shown in FIG. 18A. The other components as shown in FIG. 19 correspond to those shown in FIG. 18A, and therefore will not be repeated, for ease of reference.

FIGS. 20A-20D illustrate a series of steps by which the sensor stick 400 can be constructed. The sequence of steps shown in FIGS. 20A-20D correspond to some of the steps in the flowchart of FIG. 21, and therefore FIG. 21 will be referred to in parallel with FIGS. 20A-20D.

Figure 21:
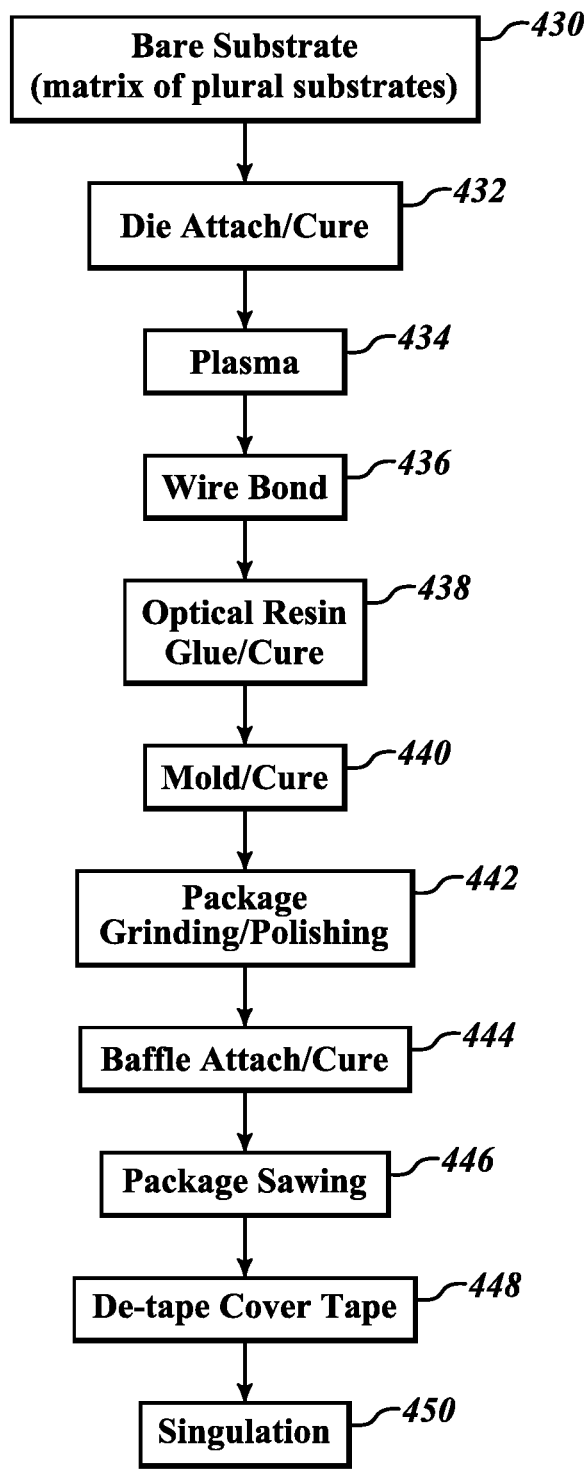
FIG. 21 is a flowchart illustrating a series of steps carried out in the construction of the mobile sensor stick of FIG. 17.

In a first step 430, as shown in FIG. 21, a bare printed circuit board substrate is provided. In most embodiments, this is a laminated substrate having alternating and conductive and insulating layers. This will be in the form of a large array having a plurality of substrates, in most instances more than a hundred substrates for a hundred different sensor sticks 400. They begin as a large matrix or array and a single printed circuit board, and then later will be singulated as explained herein. In a subsequent step 432, the individual dies are attached to the correct locations in the matrix for the sensor sticks 400. These are attached by pick and place machines and are soldered with the appropriate technique so as to be electrically connected on the back side to the exposed bonding pads of the substrate 401. After this, the assembly is subjected to the appropriate heating step 434 such as in a plasma or other appropriate adhering technique that provides electrical connection between the individual semiconductor die and environmental sensors to the sensor stick 400. While the use of plasma bonding is shown in step 434, any acceptable technique for electrically connecting the various sensors to the respective dies to which they are connected, and then the connecting of the dies to the printed circuit board 401 are acceptable. After this, the various chips are wire bonded to the printed circuit board as well, so that individual leads may be connected in the wire bond step 436. After this, the appropriate optical resin is applied and then cured, the techniques of which have been previously described with respect to the other embodiments of the proximity sensor. This optical resin may be used on the light emitters as well as on the light projector, or any other light transmitting or receiving die location. At this stage the appropriate cover tape is positioned over the environmental sensor 404 to ensure that during the application of the various chemicals, resins, and other etching, that the environmental sensor 404 is not compromised or damaged. After all of the appropriate sensors and/or transmitters are mounted on the substrate 401 of the sensor stick 400, then the sensor stick is placed in a cavity of a mold and encapsulation material 403 is applied in order to encase the various substrates and semiconductor chips. After the encapsulation material 403 has been applied, the sensor stick is of the status shown in FIG. 20A. At this stage, step 442 of FIG. 21 is carried out by the appropriate etching, grinding, polishing, or otherwise removal of the upper portion of the encapsulation layer 403. This layer is removed until the appropriate portions of each sensor are ready for exposure. Namely, the removal is carried out in an anisotropic fashion to expose the light transmitting and light receiving members, while at the same time providing an opening for access to the environmental sensors 404, as shown in FIG. 20B. After this, the appropriate baffle, lenses, in step 444 as shown in FIG. 21, which can be seen as layers 426 and 428 in FIG. 20C. In particular, the appropriate cover with the apertures, focusing members, and the like are added so as to provide a final package. After this, in step 446, the matrix of packages that was present in FIG. 20A and in step 430 is cut along what will be the boundaries of the sensor stick 400, so that the individual sensor sticks are prepared for singulation. At this stage the final cover or the environmental sensor 404 is removed, as can be seen by compared FIG. 20C to FIG. 20D. This can be done by the appropriate etch, whether anisotropic ion etch, isotropic wet etch, selective laser ablation, or the like.

Final singulation is carried using well-known techniques, such as those described herein previously with respect to FIGS. 15E-15H and 16. This may include a sawing tape in step 448, and then final singulation is illustrated in step 450.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of fabricating a sensor, comprising:
coupling a semiconductor sensor die to a first substrate, the semiconductor sensor die having a light receiving sensor area on first surface of the semiconductor sensor die and a first plurality of contact pads;
positioning a light emitting device adjacent to the semiconductor die, the light emitting device having at least one contact pad electrically coupled to the semiconductor sensor die;
placing a first optical resin overlying the light emitting device;
placing a second optical resin overlying the light receiving sensor area;
covering exposed portions of the semiconductor sensor die, the light emitting device, the first optical resin and the second optical resin with an opaque encapsulation polymer to a height that covers a first surface of the first and second optical resins; and
exposing portions of the first and second optical resins by removing portions of the opaque encapsulation polymer.

2. The method of claim 1, further comprising:
depositing the first optical resin as a liquid directly onto the light emitting device; and
curing the liquid resin to a solid form prior to covering the exposed portions with the encapsulation polymer.

3. The method of claim 1, further comprising:
depositing the second optical resin as a liquid directly onto the semiconductor sensor die; and
curing the liquid to a solid form prior to covering the exposed portions with the encapsulation polymer.

4. The method of claim 1, further including:
forming a baffle layer overlying the encapsulation polymer and at least a portion of the first and second optical resins.

5. The method of claim 1, further including:
electrically connecting the light emitting device to the semiconductor sensing die via a bonding wire that extends from a first portion of the light emitting device to a first portion of the semiconductor sensing die.

6. The method of claim 1, further comprising:
forming a recess portion between the first optical resin and the second optical resin; and
filling the recess portion with an opaque material.

7. The method of claim 6, wherein the opaque material includes at least one of a black glue material or another opaque adhesive material.

8. The method of claim 1, further comprising:
forming an encapsulation material over the first substrate; and
patterning the encapsulation material to expose the first optical resin and the second optical resin.

9. A method, comprising:
coupling a semiconductor die to a first substrate, the semiconductor die having a light receiving sensor area on a first surface of the semiconductor die and a first plurality of contact pads;
placing a light emitting device adjacent to the first surface of the semiconductor die;
placing a first optical resin overlying the light emitting device;
placing a second optical resin overlying the light receiving sensor area;
forming a molding compound that extends as a single contiguous member over the first optical resin, the second optical resin, and a space between the first and second optical resins; and
placing a glass element over the first optical resin, the second optical resin and at least a portion of a first surface of the molding compound that is flush with the first optical resin and the second optical resin.

10. The method of claim 9, wherein the forming the molding compound includes:
covering exposed portions of the semiconductor die, the light emitting device, the first optical resin and the second optical resin with an opaque encapsulation polymer to a height that covers a first surface of the first and second optical resins; and
exposing the first and second optical resins by removing the opaque encapsulation polymer.

11. The method of claim 10, further comprising:
depositing the first optical resin as a liquid directly onto the light emitting device; and
curing the liquid to a solid form prior to covering the exposed portions with the molding compound.

12. The method of claim 9, further comprising:
forming a single package by separating a portion of the first substrate to which the semiconductor die is coupled from another portion of the same first substrate.

13. The method of claim 9, further comprising:
electrically coupling the light emitting device to the semiconductor die via at least one contact pad of the light emitting device.

14. The method of claim 9, further including:
forming a baffle layer overlying the molding compound and at least a portion of the first and second optical resins.

15. The method of claim 9, further comprising:
electrically coupling the light emitting device to the semiconductor die via a bonding wire that extends from a first region of the light emitting device to a first region of the semiconductor die.

16. The method of claim 9, wherein the placing the glass element includes:
forming a recess into the molding compound between the first optical resin and the second optical resin; and
filling the recess with an opaque material.

17. A structure, comprising:
a first substrate having a first plurality of contact pads on a first side of the first substrate;
a semiconductor die having a light sensor area on a first surface of the semiconductor die and a second plurality of contact pads, the semiconductor die being electrically connected to the first plurality of contact pads and also mechanically secured to the first substrate;
a light emitting device mounted directly on the semiconductor die;
a molding compound encapsulating the semiconductor die and having a first aperture exposing the light emitting device and a second aperture exposing the light sensor area; and
a first resin lens that is within the first aperture and encapsulates the light emitting device except for a lower surface of the light emitting device that abuts the first surface of the semiconductor die and a second resin lens that is within the second aperture and overlaps the light sensor area and is separate from the first resin lens, wherein the first resin lens and the second resin lens are of different material from the molding compound.

18. The structure of claim 17, wherein the light emitting device is electrically coupled to the semiconductor die via at least one bonding wire that extends from a first region of the light emitting device to a first region of the semiconductor die or a contact pad of the light emitting device.

19. The structure of claim 18, wherein the light emitting device includes a third plurality of contact pads.

20. The structure of claim 19, further comprising:
a wire coupled between a contact pad of the semiconductor die and a contact pad of the light emitting device.

* * * * *